US010165665B2

(12) United States Patent
Nogiwa

(10) Patent No.: US 10,165,665 B2
(45) Date of Patent: Dec. 25, 2018

(54) LASER APPARATUS AND EXTREME ULTRAVIOLET LIGHT GENERATING APPARATUS

(71) Applicant: Gigaphoton Inc., Tochigi (JP)

(72) Inventor: Seiji Nogiwa, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 15/454,027

(22) Filed: Mar. 9, 2017

(65) Prior Publication Data
US 2017/0181259 A1 Jun. 22, 2017

Related U.S. Application Data

(63) Continuation of application No. PCT/JP2014/078522, filed on Oct. 27, 2014.

(51) Int. Cl.
H05G 2/00 (2006.01)
H01L 21/027 (2006.01)
(Continued)

(52) U.S. Cl.
CPC ......... H05G 2/008 (2013.01); G03F 7/70025 (2013.01); G03F 7/70033 (2013.01);
(Continued)

(58) Field of Classification Search
None
See application file for complete search history.

(56) References Cited

U.S. PATENT DOCUMENTS 8,311,066 B2 * 11/2012 Krzysztof ............... H01S 3/235
372/19
2010/0193710 A1 * 8/2010 Wakabayashi ......... B82Y 20/00
250/504 R
(Continued)

FOREIGN PATENT DOCUMENTS

JP 2010-226096 A 10/2010
JP 2010226096 A * 10/2010 ............ H01S 3/235
(Continued)

OTHER PUBLICATIONS

International Search Report issued in PCT/JP2014/078522; dated May 19, 2015.
(Continued)

Primary Examiner — Amdrew Smyth
(74) Attorney, Agent, or Firm — Studebaker & Brackett PC

(57) ABSTRACT

A laser beam having desired properties is output at desired timings. A laser apparatus is a laser apparatus for use with an extreme ultraviolet light generating apparatus that generates extreme ultraviolet light at a repetition frequency which is set in advance, and may be equipped with: a semiconductor laser that outputs a laser beam when a trigger signal is input thereto; an optical switch that switches between a state in which the laser beam passes therethrough and a state in which the laser beam does not pass therethrough, provided along the optical path of the laser beam; and a control unit configured to output the trigger signal to the semiconductor laser at a frequency which is an integer multiple of the repetition frequency, and to control the optical switch such that the laser beam passes therethrough at the repetition frequency.

10 Claims, 16 Drawing Sheets

(51) Int. Cl.

| | |
|---|---|
| *G03F 7/20* | (2006.01) |
| *H01S 5/042* | (2006.01) |
| *H01S 5/06* | (2006.01) |
| *H01S 5/50* | (2006.01) |
| *H01S 5/34* | (2006.01) |
| *H01S 5/40* | (2006.01) |
| *H01S 3/223* | (2006.01) |
| *H01S 3/23* | (2006.01) |
| *H01S 5/024* | (2006.01) |
| *H01S 5/12* | (2006.01) |

(52) U.S. Cl.
CPC ............ *H01L 21/027* (2013.01); *H01S 3/235* (2013.01); *H01S 3/2366* (2013.01); *H01S 5/042* (2013.01); *H01S 5/0617* (2013.01); *H01S 5/3402* (2013.01); *H01S 5/4012* (2013.01); *H01S 5/50* (2013.01); *H05G 2/003* (2013.01); *H01S 3/2232* (2013.01); *H01S 3/2316* (2013.01); *H01S 5/02415* (2013.01); *H01S 5/12* (2013.01)

(56) References Cited

U.S. PATENT DOCUMENTS

2013/0032735 A1* 2/2013 Nowak ................. H01S 3/0085
250/504 R
2013/0148674 A1* 6/2013 Nowak ............... H01S 5/06216
372/26
2014/0203194 A1* 7/2014 Nagano ............... G03F 7/70025
250/494.1
2014/0264089 A1 9/2014 Kim et al.
2015/0043599 A1* 2/2015 Yanagida ............... H01S 3/1106
372/18

FOREIGN PATENT DOCUMENTS

| JP | 2012-182434 | A | | 9/2012 | |
|---|---|---|---|---|---|
| JP | 2012182434 | A | * | 9/2012 | ......... H01S 5/06216 |
| JP | 2013-065804 | A | | 4/2013 | |
| JP | 2013065804 | A | * | 4/2013 | ........... H01S 3/0085 |
| JP | 2013-093308 | A | | 5/2013 | |
| JP | 2013093308 | A | * | 5/2013 | ......... G03F 7/70025 |
| JP | 2013161760 | A | * | 8/2013 | ......... H01R 3/62938 |
| JP | WO 2013161760 | A1 | * | 10/2013 | ............ H01S 3/1106 |
| WO | 2013/161760 | A1 | | 10/2013 | |

OTHER PUBLICATIONS

Written Opinion issued in PCT/JP2014/078522; dated May 19, 2015.

An Office Action mailed by the Japanese Patent Office dated Apr. 17, 2018, which corresponds to Japanese Patent Application No. 2016-556065 and is related to U.S. Appl. No. 15/454,027.

\* cited by examiner

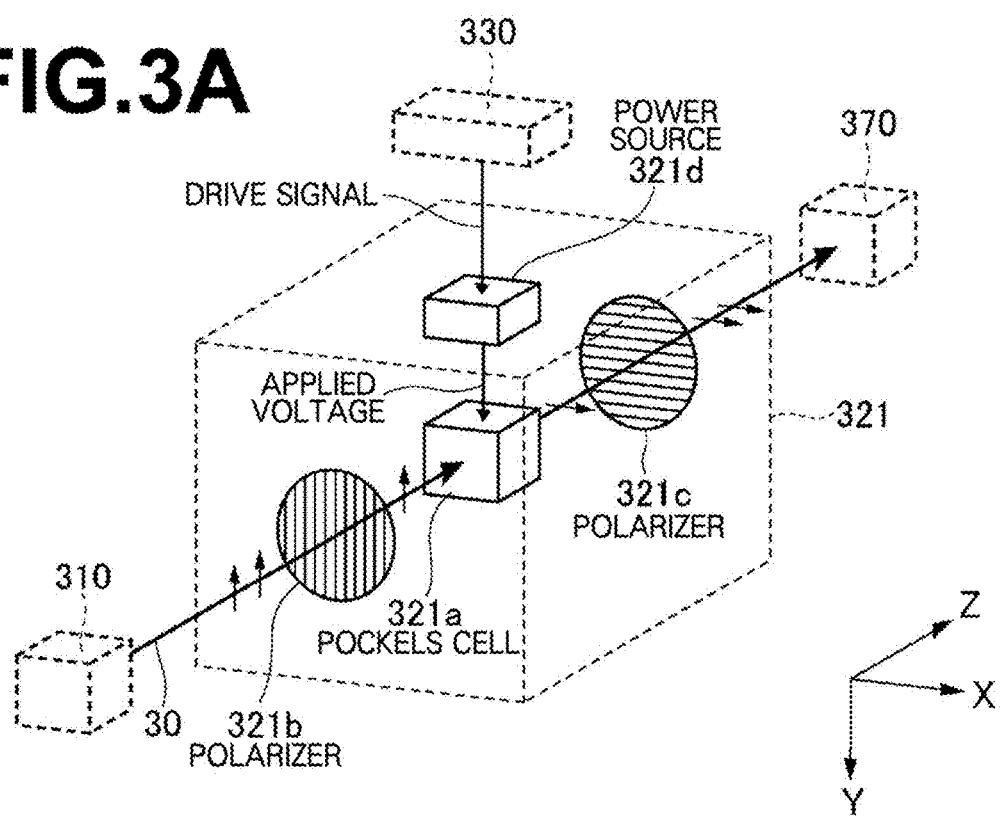

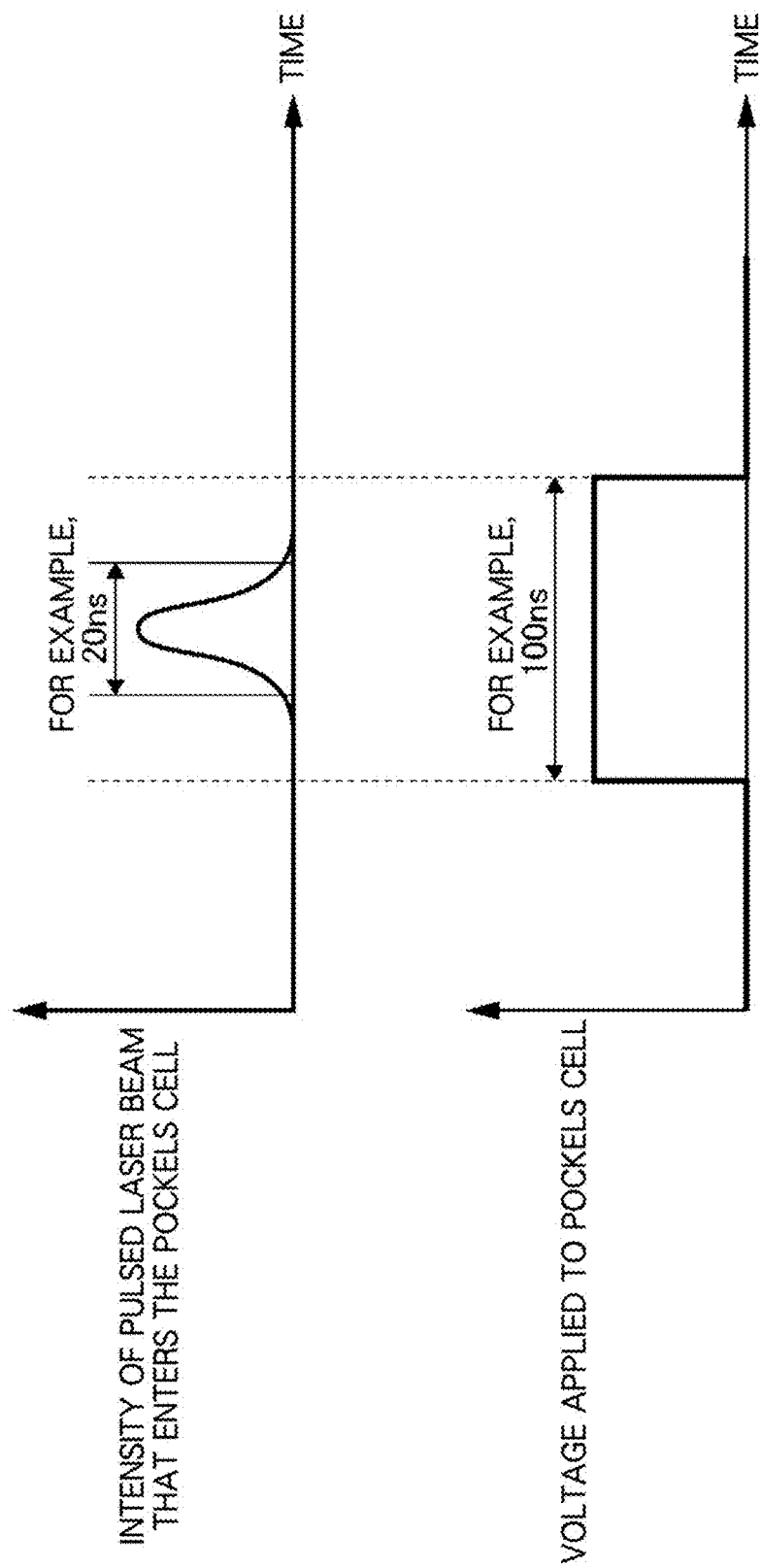

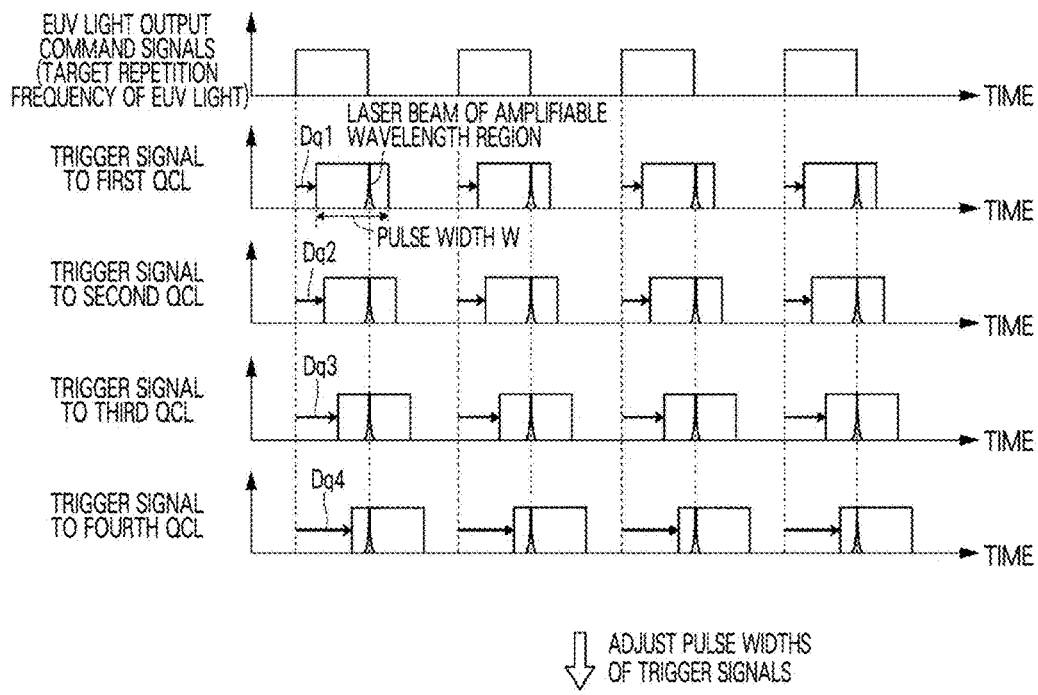
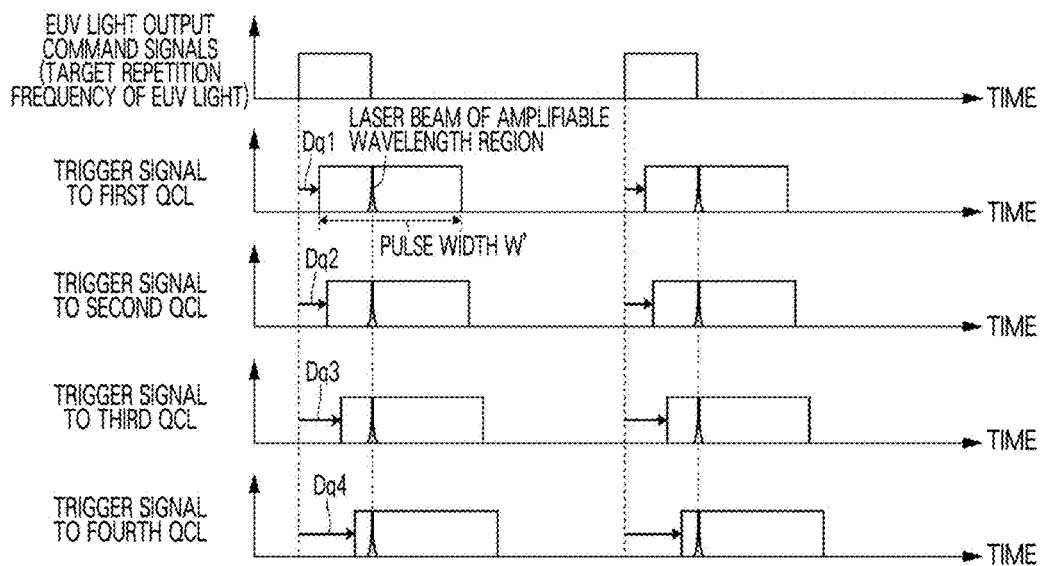
FIG.12

FIG.13

| REPETITION FREQUENCY (kHz) | PULSE WIDTH (ns) |
|---|---|
| 100 | 400 |
| 50 | 800 |
| 20 | 2000 |

US 10,165,665 B2

LASER APPARATUS AND EXTREME ULTRAVIOLET LIGHT GENERATING APPARATUS

CROSS REFERENCE TO RELATED APPLICATIONS

The present application is a Continuation application of International Application No. PCT/JP2014/078522 filed on Oct. 27, 2014. The content of the application is incorporated herein by reference in its entirety.

BACKGROUND

1. Technical Field

The present disclosure is related to a laser apparatus and to an extreme ultraviolet light generating apparatus.

2. Related Art

Recently, as semiconductor processes have become finer, transfer patterns for use in photolithography of semiconductor processes have also become finer. In the next generation, microfabrication at 70 nm to 45 nm, and further, microfabrication at 32 nm or less will be in demand. In order to meet this demand for microfabrication at 32 nm or less, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system.

Three types of EUV light generating apparatuses have been proposed. The three types are: an LPP (Laser Produced Plasma) type apparatus that employs plasma which is generated by irradiating a laser beam onto a target substance; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
 U.S. Published Patent Application No. 2013/0148674
[Patent Document 2]
 U.S. Pat. No. 8,311,066
[Patent Document 3]
 U.S. Published Patent Application No. 2010/0193710
[Patent Document 4]
 U.S. Published Patent Application No. 2013/0032735

SUMMARY

A laser apparatus according to one aspect of the present disclosure is a laser apparatus for use with an extreme ultraviolet light generating apparatus that generates extreme ultraviolet light at a repetition frequency which is set in advance, and may include:
 a semiconductor laser that outputs a laser beam when a trigger signal is input thereto;
 an optical switch that switches between a state in which the laser beam passes therethrough and a state in which the laser beam does not pass therethrough, provided along the optical path of the laser beam; and
 a control unit configured to output the trigger signal to the semiconductor laser at a frequency which is an integer multiple of the repetition frequency, and to control the optical switch such that the laser beam passes therethrough at the repetition frequency.

A laser apparatus according to another aspect of the present disclosure is a laser apparatus for use with an extreme ultraviolet light generating apparatus that generates extreme ultraviolet light at a repetition frequency which is set in advance, and may include:
 a semiconductor laser that outputs a laser beam when a trigger signal is input thereto;
 an optical switch that switches between a state in which the laser beam passes therethrough and a state in which the laser beam does not pass therethrough, provided along the optical path of the laser beam; and
 a control unit configured to change the output timing of the trigger signal which is output to the semiconductor laser based on the repetition frequency in synchronization with the repetition frequency, and to control the optical switch such that the laser beam passes therethrough at the repetition frequency.

A laser apparatus according to still another aspect of the present disclosure is a laser apparatus for use with an extreme ultraviolet light generating apparatus that generates extreme ultraviolet light at a repetition frequency which is set in advance, and may include:
 a semiconductor laser that outputs a laser beam when a trigger signal is input thereto;
 an optical switch that switches between a state in which the laser beam passes therethrough and a state in which the laser beam does not pass therethrough, provided along the optical path of the laser beam; and
 a control unit configured to change the pulse width of the trigger signal which is output to the semiconductor laser based on the repetition frequency in synchronization with the repetition frequency, and to control the optical switch such that the laser beam passes therethrough at the repetition frequency.

An extreme ultraviolet light generating apparatus according to one aspect of the present disclosure may include:
 a semiconductor laser that outputs a laser beam when a trigger signal is input thereto;
 an optical switch that switches between a state in which the laser beam passes therethrough and a state in which the laser beam does not pass therethrough, provided along the optical path of the laser beam;
 a control unit configured to output the trigger signal to the semiconductor laser at a frequency which is an integer multiple of the repetition frequency, and to control the optical switch such that the laser beam passes therethrough at the repetition frequency; and
 a target supply unit configured to supply a target that emits extreme ultraviolet light when the laser beam is irradiated thereon to a chamber into which the laser beam which has passed through the optical switch is introduced, at a frequency which is an integer multiple of the repetition frequency.

BRIEF DESCRIPTION OF THE DRAWINGS

Embodiments of the present disclosure will be described below as examples, with reference to the attached drawings.

FIG. 3A is a diagram for explaining the detailed structure of a first optical switch.

FIG. 3B is a diagram for explaining the relationship between the timing at which a pulsed laser beam enters a Pockels cell and voltage applied to the Pockels cell.

FIG. 12 is a diagram for explaining the pulse widths of trigger signals output from a control unit included in a laser apparatus according to a third embodiment.

FIG. 13 is a diagram that illustrates the relationship between the repetition frequencies of trigger signals output to QCL's and pulse widths.

DETAILED DESCRIPTION OF THE PREFERRED EMBODIMENTS

Figure 1:
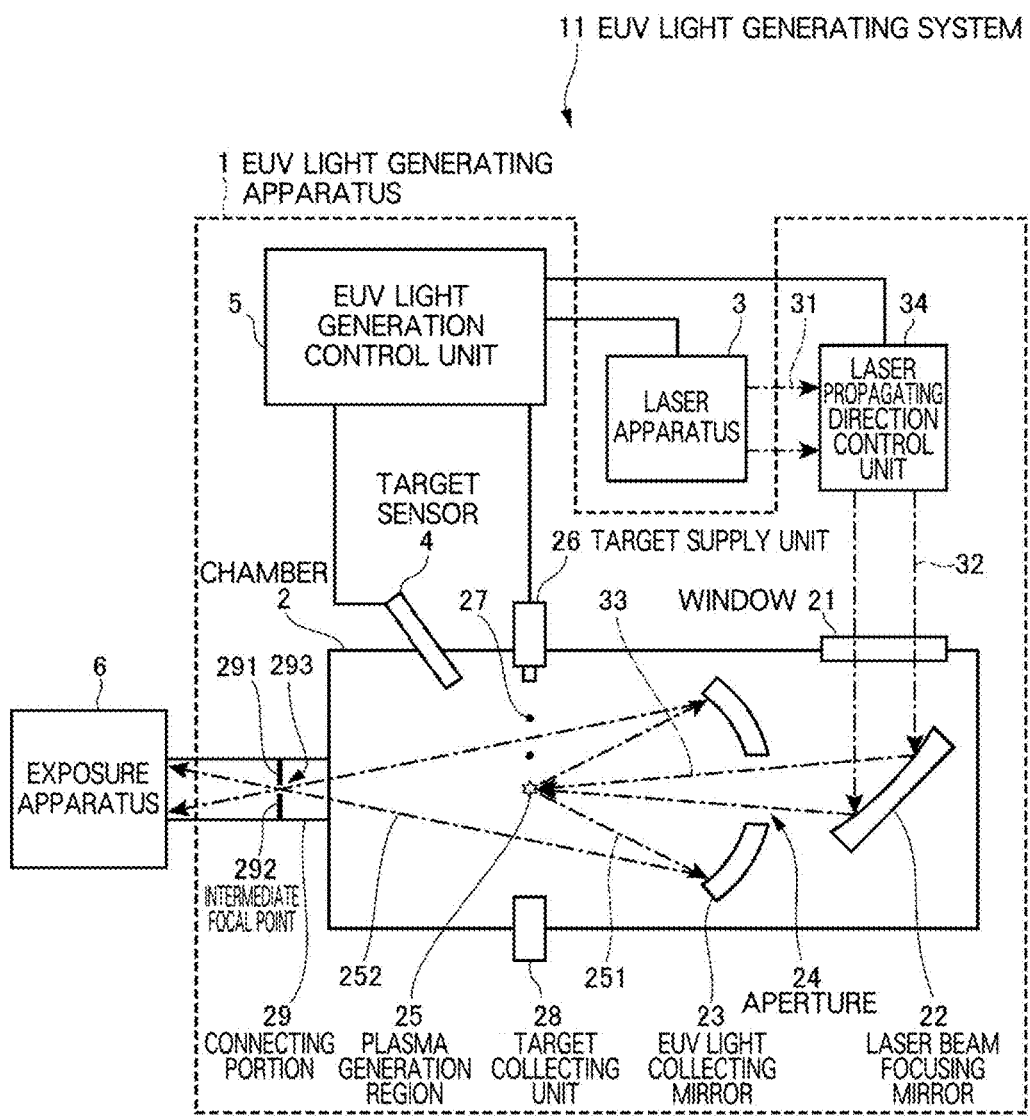
FIG. 1 is a diagram that schematically illustrates the configuration of an exemplary EUV light generating system of the LPP type.

—Contents—
1. Overview
2. Terms
3. Overview of EUV Light Generating System
   3.1 Configuration
   3.2 Operation
4. Laser Apparatus for use with EUV Light Generating System
   4.1 Configuration
   4.2 Operation
   4.3 Optical Switch
   4.4 Regenerative Amplifier
   4.5 Quantum Cascade Laser
5. Objective
6. EUV Light Generating System Including Laser Apparatus According to First Embodiment
   6.1 Configuration
   6.2 Operation
   6.3 Effect
7. EUV Light Generating System Including Laser Apparatus According to Second Embodiment
8. EUV Light Generating System Including Laser Apparatus According to Third Embodiment
9. Other Items
   9.1 Hardware Environment of Control Units
   9.2 Modification of Laser Apparatus Related to Generation of Trigger Signals
   9.3 Other Modifications Embodiments of the present disclosure will be described in detail with reference to the attached drawings. The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted with the same reference numbers, and redundant descriptions will be omitted.

1. Overview

The present disclosure discloses at least the embodiments below.

A laser apparatus 3 is a laser apparatus 3 which is employed with an EUV light generating apparatus 1 that generates EUV light 252 at a repetition frequency which is set in advance, and may include: first through fourth QCL's 311~314 that output pulsed laser beams 30; first through fourth optical switches 321, 322, 373, and 374 that switch between a state in which the pulsed laser beams 30 pass therethrough and a state in which the pulsed laser beams 30 do not pass therethrough, provided along the optical paths of the pulsed laser beams 30; and a control unit 330 configured to control the optical switches 321, 322, 373, and 374 such that the pulsed laser beams 30 pass therethrough at the repetition frequency.

By adopting such a configuration, the laser apparatus 3 will be capable of outputting a pulsed laser beam 31 having desired properties at desired timings, even when operating conditions thereof are changed.

2. Terms

A "target" refers to a substance which is introduced into a chamber and irradiated with a laser beam. The target turns into plasma when irradiated by the laser beam and emits EUV light. A "droplet" refers to one form in which the target is supplied into the chamber. An "axis of an optical path" refers to an axis that passes through the center of the cross section of a pulsed laser beam along the direction in which the pulsed laser beam propagates. An "optical path" refers to a path through which the pulsed laser beam passes. The optical path may include the axis of the optical path. An "upstream side" of the optical path of the pulsed laser beam is the side toward a laser oscillator. Conversely, a "downstream side" of the optical path of the pulsed laser beam is the side away from the laser oscillator. An "optical switch" is an element that switches between a state in which the optical path of an incident laser beam is changed and a state in which the optical path of the incident laser beam is not changed. Thereby, the optical switch may switch between a state in which the incident laser beam passes therethrough and a state in which the incident laser beam does not pass therethrough. The optical switch may change the optical path of the incident laser beam by electrical signals.

3. Overview of EUV Light Generating System

<3.1 Configuration>

FIG. 1 is a diagram that schematically illustrates the configuration of an exemplary EUV light generating system of the LPP type. An EUV light generating apparatus 1 may be employed with at least one laser apparatus 3. In the present disclosure, a system that includes the EUV light generating apparatus 1 and the laser apparatus 3 may be referred to as an EUV light generating system 11. As illustrated in FIG. 1 and described in detail later, the EUV light generating apparatus 1 may include a chamber 2 and a target supply unit 26. The chamber 2 may be capable of being sealed to be gastight. The target supply unit 26 may be mounted on the chamber 2 so as to penetrate through a wall of the chamber 2, for example. The material which is supplied by the target supply unit 26 as a target substance may include, but is not limited to, tin, terbium, gadolinium, lithium, xenon, or any combination including two or more thereof.

A wall of the chamber 2 may have at least one aperture penetrating therethrough. A window 21 may be provided at the aperture. A pulsed laser beam 32 which is output from the laser apparatus 3 may be transmitted through the window 21. An EUV light collecting mirror 23 having a spheroidal reflective surface may be provided in the chamber 2, for example. The EUV light collecting mirror 23 may have a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned in a plasma generation region 25 and the second focal point is positioned at an intermediate focal (IF) point 292, for example. The EUV light collecting mirror 23 may have an aperture 24 formed at the center thereof, and a pulsed laser beam 33 may pass through the aperture 24.

The EUV light generating apparatus 1 may further include an EUV light generation control unit 5 and a target sensor 4. The target sensor 4 may have an image capturing function and may detect the presence, the trajectory, position, speed, etc. of a target 27.

Further, the EUV light generating apparatus 1 may include a connecting portion 29 that enables the interior of the chamber 2 to be in communication with the interior of an exposure apparatus 6. A wall 291 having an aperture 293 formed therethrough may be provided in the connecting portion 29. The wall 291 may be provided such that the aperture 293 is positioned at the second focal point of the EUV light collecting mirror 23.

The EUV light generating apparatus 1 may additionally include a laser beam propagating direction control unit 34, a laser beam focusing mirror 22, and a target collecting unit 28 for collecting the target 27. The laser beam propagating direction controlling unit 34 may be equipped with an optical element for regulating the propagating direction of a laser beam, and an actuator for adjusting the position, orientation, etc. of the optical element.

<3.2 Operation>

Referring to FIG. 1, the pulsed laser beam 31 which is output from the laser apparatus 3 propagates via the laser beam propagating direction control unit 34, passes through the window 21 as a pulsed laser beam 32, and then enters the chamber 2. The pulsed laser beam 32 may propagate through the chamber 2 along at least one laser beam path, be reflected by the laser beam focusing mirror 22, and be irradiated onto at least one target 27 as the pulsed laser beam 33.

The target supply unit 26 may be configured to output the target 27 toward the plasma generation region 25 in the interior of the chamber 2. At least one pulse which is included in the pulsed laser beam 33 may be irradiated onto the target 27. The target 27 which is irradiated by the pulsed laser beam turns into plasma, and EUV light 251 is emitted from the plasma along with light having other wavelengths.

The EUV light 251 may be selectively reflected by the EUV light collecting mirror 23. EUV light 252 which is reflected by the EUV light collecting mirror 23 may be focused at the intermediate focal point 292, and output to the exposure apparatus 6. Note that a plurality of pulses which are included in the pulsed laser beam 33 may be irradiated onto a single target 27.

The EUV light generation control unit 5 may be configured to totally control the entire EUV light generating system 11. The EUV light generation control unit 5 may be configured to process image data captured by the target sensor 4 or the like. In addition, the EUV light generation control unit 5 may control at least one of the timing at which the target 27 is output and the output direction of the target 27. Further, the EUV light generation control unit 5 may control at least one of the output timing of the laser apparatus 3, the propagating direction of the pulsed laser beam 32, and the focal position of the pulsed laser beam 33. The above items which are controlled are merely examples, and other additional items may be controlled as necessary.

4. Laser Apparatus for Use with EUV Light Generating System

<4.1 Configuration>

Figure 2:
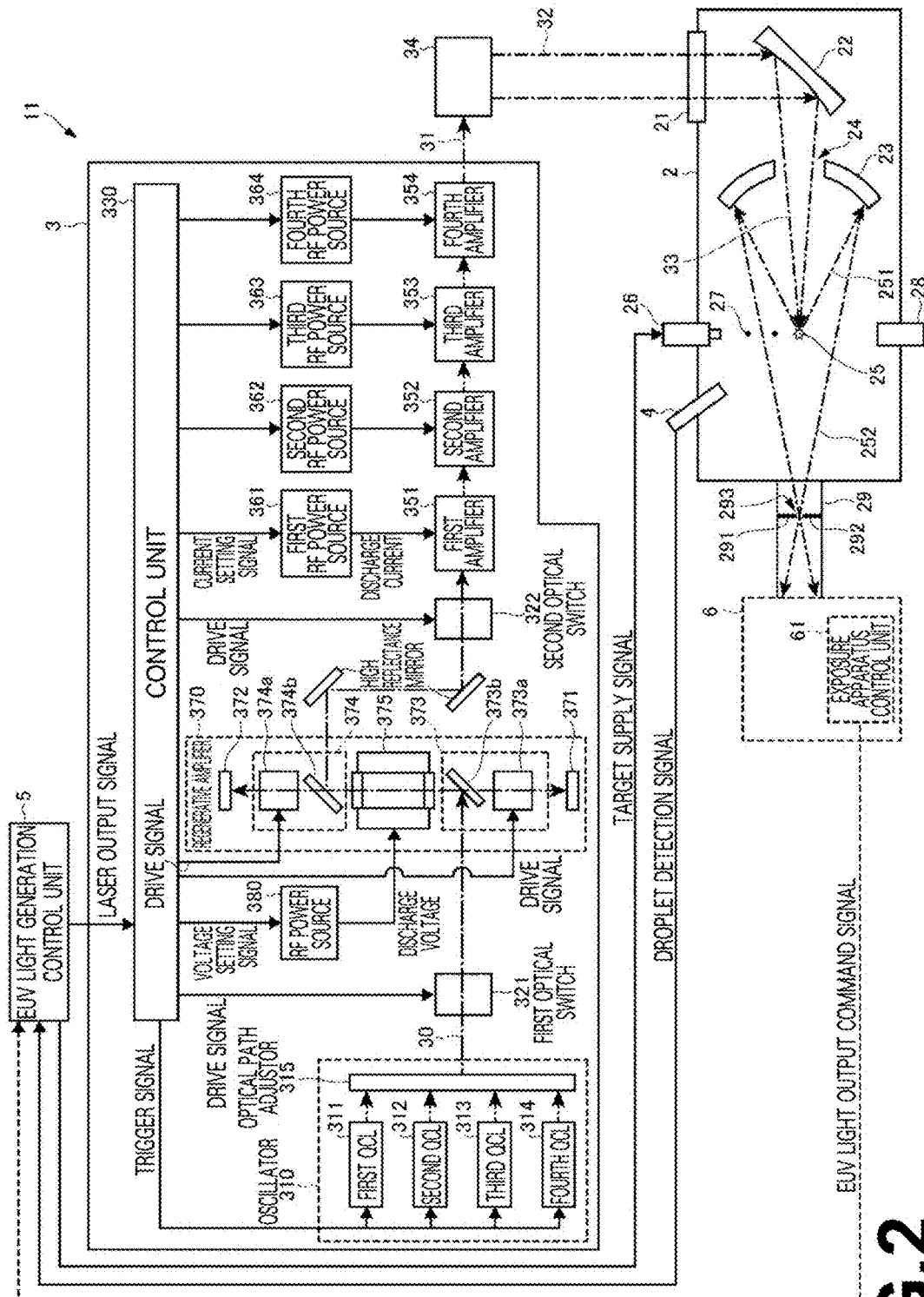
FIG. 2 is a diagram that illustrates the configuration of an EUV light generating system in which the specific structure of a laser apparatus is illustrated.

The specific configuration of the laser apparatus 3 which is employed with the EUV light generating apparatus 1 will be described with reference to FIG. 2. FIG. 2 is a diagram that illustrates the configuration of the EUV light generating system 11 in which the specific structure of the laser apparatus 3 is illustrated. The EUV light generating system 11 of FIG. 2 may include the EUV light generating apparatus 1 and the laser apparatus 3 which are the same as those of the EUV light generating system 11 illustrated in FIG. 1. Descriptions of components of the EUV light generating system 11 of FIG. 2 which are the same as those of the EUV light generating system 11 illustrated in FIG. 1 will be omitted.

The laser apparatus may be equipped with an oscillator 310, a first optical switch 321, a second optical switch 322, the control unit 330, first through fourth amplifiers 351~354, first through fourth RF (Radio Frequency) power sources 361~364, a regenerative amplifier 370, and a RF (Radio Frequency) power source 380. In the present embodiment, the laser apparatus 3 is described as an example in which the number of amplifiers, which are the first through fourth amplifiers 351~354, is four, for descriptive purposes. However, the number of amplifiers is not particularly limited, and the laser apparatus 3 may be equipped with one or a plurality of amplifiers. The number of the first through fourth RF power sources 361~364 may be the same as the number of the first through fourth amplifiers 351~354. The oscillator 310 and the first through fourth amplifiers 351~354 may constitute a MOPA (Master Oscillator Power Amplifier) system.

The oscillator 310 may be a master oscillator that constitutes the MOPA system. The oscillator 310 may output the pulsed laser beam 30. The oscillator 310 may include semiconductor lasers and an optical path adjustor 315.

The semiconductor lasers which are included in the oscillator 310 may be quantum cascade lasers (QCL's). The semiconductor lasers which are included in the oscillator 310 may be distributed feedback semiconductor lasers. The semiconductor lasers which are included in the oscillator 310 may be semiconductor lasers that output pulsed laser beams of wavelengths which are included within a wavelength region capable of being amplified by a laser amplifier having $CO_2$ gas as an amplification medium.

A plurality of semiconductor lasers may be included in the oscillator 310. The plurality of semiconductor lasers which are included in the oscillator 310 may be the first through fourth QCL's 311~314. In the present embodiment, the oscillator 310 is described as an example in which the number of QCL's, which are the first through fourth QCL's 311~314, is four, for descriptive purposes. However, the number of QCL's is not particularly limited, and the oscillator 310 may be equipped with one or a plurality of QCL's. Each of the first through fourth QCL's 311~314 may be connected to the control unit 330. Each of the first through fourth QCL's 311~314 may be controlled by the control unit 330 to perform laser oscillation and to output a pulsed laser beam.

The first through fourth QCL's 311~314 may output pulsed laser beams having wavelengths which are different from each other. The wavelengths of the pulsed laser beams which are output by each of the first through fourth QCL's 311~314 may be within different wavelength regions which are capable of being amplified by laser amplifiers. In the present disclosure, wavelength regions which are capable of being amplified by the laser amplifiers connected after the first through fourth QCL's 311~314 from among the wavelength regions of the pulsed laser beams output by each of the first through fourth QCL's 311~314 are also referred to "amplifiable wavelength regions". Each of the first through fourth QCL's 311~314 may output a linearly polarized pulsed laser beam. The pulsed laser beams which are output by each of the first through fourth QCL's 311~314 may enter the optical path adjustor 315. Note that the detailed strictures of the first through fourth QCL's 311~314 will be described later with reference to FIG. 5.

The optical path adjustor 315 may overlap the optical paths of the pulsed laser beams which are output by the first through fourth QCL's 311~314 such that they practically become a single optical path and the pulsed laser beams are output as the pulsed laser beam 30. The optical path adjustor 315 may include optical systems which are not illustrated. The optical systems which may be included in the optical path adjustor 315 may be provided downstream from the first through fourth QCL's 311~314 along the optical paths of the pulsed laser beams which are output by the first through fourth QCL's 311~314. The pulsed laser beam 30 which passes through the single optical path via the optical path adjustor 315 and is output may enter the first optical switch 321.

The first optical switch 321 may switch between a state in which the incident pulsed laser beam 30 passes therethrough and a state in which the incident pulsed laser beam 30 does not pass therethrough. The first optical switch 321 may be provided along the optical path of the pulsed laser beam 30 which is output from the optical path adjustor 315. The first optical switch 321 may be connected to the control unit 330. The first optical switch 321 may switch between a state in which the incident pulsed laser beam 30 passes therethrough and a state in which the incident pulsed laser beam 30 does not pass therethrough under control of the control unit 330. The pulsed laser beam 30 which has passed through the first optical switch 321 may enter the regenerative amplifier 370. Note that the detailed configuration of the first optical switch 321 will be described later with reference to FIG. 3A and FIG. 3B.

The regenerative amplifier 370 may amplify the incident pulsed laser beam 30 and output the amplified pulsed laser beam 30 at a specific timing. The regenerative amplifier 370 may be provided along the optical path of the pulsed laser beam 30 which has passed through the first optical switch 321. The regenerative amplifier 370 may include a resonator mirror 371, a resonator mirror 372, the third optical switch 373, the fourth optical switch 374, and an amplifier 375.

The resonator mirrors 371 and 372 may constitute an optical oscillator of the regenerative amplifier 370. The resonator mirrors 371 and 372 may reflect the pulsed laser beam 30 which has entered into the regenerative amplifier 370 such that the pulsed laser beam 30 reciprocates between the resonator mirrors 371 and 372.

The amplifier 375 may amplify the pulsed laser beam 30 each time that the pulsed laser beam 30 reciprocates between the resonator mirrors 371 and 372. The amplifier 375 may be a laser amplifier that employs $CO_2$ gas as an amplification medium. The amplifier 375 may include a pair of discharge electrodes which are not illustrated. Each of the pair of discharge electrodes may be connected to the RF power source 380. The amplifier 375 may amplify the pulsed laser beam 30 according to discharged voltages which are supplied by the RF power source 380.

The third and fourth optical switches 373 and 374 may switch between a state in which the optical path of the incident pulsed laser beam 30 is changed and a state in which the optical path of the incident pulsed laser beam 30 is not changed. Each of the third and fourth optical switches 373 and 374 may be connected to the control unit 330. The third and fourth optical switches 373 and 374 may switch between a state in which the optical path of the incident pulsed laser beam 30 is changed and a state in which the optical path of the incident pulsed laser beam 30 is not changed under control of the control unit 330. Thereby, each of the third and fourth optical switches 373 and 374 may guide the incident pulsed laser beam 30 to the interior of the regenerative amplifier 370 and output the amplified pulsed laser beam 30 from the regenerative amplifier 370 at a specific timing.

The pulsed laser beam 30 which has been amplified by the regenerative amplifier 370 may enter the second optical switch 322 via a high reflectance mirror. Note that the detailed structure of the regenerative amplifier 370 will be described later with reference to FIG. 4.

The RF power source 380 may be a power source that supplies a high frequency discharge voltage to the amplifier 375 which is included in the regenerative amplifier 370. The RF power source 380 may be connected to the control unit 330. The RF power source 380 may supply the discharge voltage to the amplifier 375 under control of the control unit 330.

The second optical switch 322 may be an optical switch that switches between a state in which the incident pulsed laser beam 30 passes therethrough and a state in which the incident pulsed laser beam 30 does not pass therethrough. The second optical switch 322 may be provided along the optical path of the pulsed laser beam 30 which is output by the regenerative amplifier 370. The second optical switch 322 may be connected to the control unit 330. The second optical switch 322 may switch between a state in which the incident pulsed laser beam 30 passes therethrough and a state in which the incident pulsed laser beam 30 does not pass therethrough under control of the control unit 330. The pulsed laser beam 30 which has passed through the second optical switch 322 may enter the first through fourth amplifiers 351~354. Note that the detailed structure of the second optical switch 322 will be described later with reference to FIG. 3A and FIG. 3B. Here, a plurality of second optical switches 322 may be provided in the laser apparatus 3. Each of the plurality of second optical switches 322 may be provided downstream from the regenerative amplifier 370 and the first through fourth amplifiers 351~354, respectively.

The first through fourth amplifiers 351~354 may be power amplifiers that constitute the MOPA system. The first through fourth amplifiers 351~354 may be laser amplifiers that include pairs of discharge electrodes and employ $CO_2$ gas as amplification media. The first through fourth amplifiers 351~354 may be any one of a slab amplifier, a three axis orthogonal amplifier, and a high speed axial flow amplifier.

The first through fourth amplifiers 351~354 may sequentially amplify the pulsed laser beam 30 which has passed through the second optical switch 322. Specifically, the pulsed laser beam 30 output from an immediately preceding amplifier arranged on the upstream side, which is the regenerative amplifier 370 or one of the first through third amplifiers 351~353, may enter each of the first through fourth amplifiers 351~354. Each of the first through third amplifiers 351~353 may amplify the pulsed laser beam 30 that enters thereinto, and output the amplified pulsed laser beam 30 to an amplifier downstream therefrom, which is one of the second through fourth amplifiers 352~354. The fourth amplifier 354, which is the final amplifier, may amplify the pulsed laser beam 30 that enters thereinto, and output the amplified pulsed laser beam 30 to the exterior of the laser apparatus 3 as the pulsed laser beam 31.

Each of the first through fourth amplifiers 351~354 may be respectively connected to the first through fourth RF power sources 361~364. Each of the first through fourth amplifiers 351~354 may amplify the pulsed laser beam 30 that enters thereinto according to discharge currents which are respectively supplied by the first through fourth RF power sources 361~364.

The first through fourth RF power sources 361~364 may be power sources that supply discharge currents to the first through fourth amplifiers 351~354. The first through fourth RF power sources 361~364 may be connected to the control unit 330. The first through fourth RF power sources 361~364 may supply the discharge currents to the first through fourth amplifiers 351~354 under control of the control unit 330.

Here, EUV light output command signals may be transmitted by an exposure apparatus control unit 61 to the EUV light generation control unit 5 included in the EUV light generating apparatus 1 which is employed with the laser apparatus 3. The EUV light output command signals may be signals that represent control commands related to output of the EUV light 252. The EUV light output command signals may include various target values, such as a target output initiation timing, a target repetition frequency, and a target pulse energy, of the EUV light 252. Various target values of the EUV light 252 are set in the EUV light generation control unit 5 by the EUV light output command signals being transmitted.

The EUV light generation control unit 5 may generate and output target supply signals to the target supply unit 26 based on the EUV light output command signals which are transmitted from the exposure apparatus control unit 61. The target supply signals may be signals that represent control commands related to output of droplets 271 into the chamber 2. The target supply signals may be signals that control the operations of the target supply unit 26 such that the droplets 271 are output according to the various target values which are included in the EUV light output command signals. The target supply signals may include various target values, such as the target diameter of the droplets. The various target values of the droplets 271 may be values which are determined according to the various target values which are included in the EUV light output command signals. The EUV light generation control unit 5 may determine the target output initiation timing and a target repetition frequency of the droplets 271 according to the target output initiation timing and the target repetition frequency of the EUV light 252 included in the EUV light output command signals. The target repetition frequency of the droplets 271 may be the same value as the target repetition frequency of the EUV light 252. The target output initiation timing of the droplets 271 may be a value which is determined according to the target output initiation timing of the EUV light 252. The EUV light generation control unit 5 may output the target supply signals to the target supply unit 26, according to the determined target output initiation timing and the target repetition frequency of the droplets 271.

Droplet detection signals may be input to the EUV light generation control unit 5 from the target sensor 4. The droplet detection signals may be detection signals that indicate that the droplets 271, which are the target 27 to be supplied by the target supply unit 26 to the plasma generation region 25, have been output to the interior of the chamber 2. The droplets 271 may be output from the target supply unit 26 based on the target supply signals, which reflect the target output initiation timing and the target repetition frequency of the EUV light 252, which are included in the EUV light output command signals. The droplets 271 which are output from the target supply unit 26 based on the target supply signals may be detected each time that they are output. The droplet detection signals may be output by the target sensor 4 to the EUV light generation control unit 5 each time that the droplets 271 are detected. At this time, the output interval of the droplets 271 may not be strictly constant, and may have a certain degree of instability. For this reason, the repetition frequency of the droplet detection signals will be approximately the same as the target repetition frequency of the EUV light 252, but slight fluctuations may occur. The expressions "substantially the same value as the target repetition frequency of the EUV light 252" and "repetition frequency that reflects the target repetition frequency of the EUV light 252" are employed in the following description. These expressions are employed to refer to cases in which although a repetition frequency differs slightly from the target repetition frequency of the EUV light 252, the repetition frequency is practically the same as the target repetition frequency of the EUV light 252. The same applies to the expressions "substantially the same value as a master repetition frequency" and "repetition frequency that reflects the master repetition frequency" which are also employed in the description below. Droplet detection signals that reflect the EUV light output command signals are input to the EUV light generation control unit 5. The repetition frequency of the droplet detection signals may be substantially the same value as the target repetition frequency of the EUV light 252.

The EUV light generation control unit 5 may generate and output laser output signals to the control unit 330, based on the droplet detection signals that reflect the EUV light output command signals. The laser output signals are signals that represent control commands related to the output of the pulsed laser beam 31. The laser output signals may be signals that control the operations of the laser apparatus 3 such that the pulsed laser beam 31 is output according to the various target values of the EUV light 252 included in the EUV light output command signals. The laser output signals may include various target values, such as the target pulse energy of the pulsed laser beam 31. The target pulse energy of the pulsed laser beam 31 may be a value which is determined according to the target pulse energy of the EUV light 252. The EUV light generation control unit 5 may output the laser output signals for each pulse, at timings which are delayed from points in time when the droplet detection signals that reflect the EUV light output command signals are input by a predetermined amount of delay time. Note that the hardware configuration of the EUV light generation control unit 5 will be described later with reference to FIG. 14.

Meanwhile, the control unit 330 may be connected to the EUV light generation control unit 5, and the laser output signals which are output from the EUV light generation control unit 5 may be input to the control unit 330. The control unit 330 may control the operations of the constituent elements included in the laser apparatus 3, based on the laser output signals.

The control unit 330 may output trigger signals to each of the first through fourth QCL's 311~314, based on the laser output signals. The control unit 330 may output trigger signals to each of the first through fourth QCL's 311~314 synchronized with the timings at which the laser output signals are input. The trigger signals may be signals that provide momentum for the first through fourth QCL's 311~314 to perform laser oscillation and output pulsed laser beams. The repetition frequency of the trigger signals may regulate the repetition frequencies of each of the first through fourth QCL's 311~314. The repetition frequency of the trigger signals may be the same value as the repetition frequency of the droplet detection signals. The timings at which the trigger signals are output may regulate the timings at which each of the first through fourth QCL's 311~314 initiates operations related to laser oscillation. The first through fourth QCL's 311~314 can perform laser oscillation at the repetition frequency of the trigger signals and output pulsed laser beams.

The trigger signals may include set values for excitation currents which are supplied to each of the first through fourth QCL's 311~314. The set values for excitation currents included in the trigger signals may be determined based on the target pulse energy of the pulsed laser beam 31 which is included in the laser output signals and the pulse energy of the pulsed laser beam 30 which is measured by an energy monitor, which is not illustrated. The first through fourth QCL's 311~314 can perform laser oscillation by excitation currents corresponding to the set values for the excitation currents included in the input trigger signals and output pulsed laser beams.

The control unit 330 may output the trigger signals for the first through fourth QCL's 311~314, at timings which are delayed from points in time when the laser output signals are input from the EUV light generation control unit 5 by a predetermined amount of delay time. The delay time which is added to the trigger signals may be different delay times Dq1~Dq4 for each of the trigger signals which are output to the first through fourth QCL's 311~314, respectively. As described above, the amplifiable wavelength region corresponding to the pulsed laser beam output by each of the first through fourth QCL's 311~314 may be different from each other. The timings at which pulsed laser beams each having a different wavelength are output by each of the first through fourth QCL's 311~314 may be different from each other. The lengths of the delay times Dq1~Dq4 may be determined such that pulsed laser beams having wavelengths within the amplifiable wavelength regions are output from each of the first through fourth QCL's 311~314 at approximately the same timing.

In addition, the control unit 330 may output drive signals to each of the first through fourth optical switches 321, 322, 373, and 374, based on the laser output signals. The control unit 330 may output the drive signals to each of the first through fourth optical switches 321, 322, 373, and 374 synchronized with the timing at which the laser output signals are input from the EUV light generation control unit 5. The drive signals for the optical switches may be signals that control the operations of the first through fourth optical switches 321, 322, 373, and 374 such that the pulsed laser beam 30 that enters each of the first through fourth optical switches 321, 322, 373, and 374 passes therethrough.

The control unit 330 may output the drive signals to each of the first through fourth optical switches 321, 322, 373, and 374, at timings which are delayed from points in time when the laser output signals are input from the EUV light generation control unit 5 by a predetermined amount of delay time. The delay time which is added to the drive signals may be different delay times Dp1~Dp4 for each of the drive signals which are output to the first through fourth optical switches 321, 322, 373, and 374, respectively. The lengths of the delay times Dp1~Dp4 may be determined such that pulsed laser beams having wavelengths within the amplifiable wavelength regions pass through each of the first through fourth optical switches 321, 322, 373, and 374.

In addition, the control unit 330 may output voltage setting signals to the RF power source 380 based on the laser output signals. The control unit 330 can output the voltage setting signals to the RF power source 380 synchronized with the timing at which the laser output signals are input from the EUV light generation control unit 5. The voltage setting signals output to the RF power source 380 may be signals that set the values of the discharge voltage which is supplied to the amplifier 375 of the regenerative amplifier 370 by the RF power source 380. The set value of the discharge voltage included in the voltage setting signal may be determined based on the target pulse energy of the pulsed laser beam 31 which is included in the laser output signals and the pulse energy of the pulsed laser beam 30 which is measured by an energy monitor, which is not illustrated. The RF power source 380 can supply discharge voltages to the amplifier 375 of the regenerative amplifier 370 according to the set values which are included in the input voltage setting signals. The amplifier 375 of the regenerative amplifier 370 is capable of amplifying the pulsed laser beam 30 that enters the regenerative amplifier 370 according to the supplied discharge voltage.

In addition, the control unit 330 may output current setting signals to each of the first through fourth RF power sources 361~364, based on the laser output signals. The control unit 330 can output the current setting signals to the first through fourth RF power sources 361~364 synchronized with the timing at which the laser output signals are input from the EUV light generation control unit 5. The current setting signals output to the RF power sources 361~364 may be signals that set the values of the discharge current which is supplied to the first through fourth amplifiers 351~354 by the first through fourth RF power sources 361~364. The set values of the discharge current included in the current setting signals may be determined based on the target pulse energy of the pulsed laser beam 31 which is included in the laser output signals and the pulse energy of the amplified pulsed laser beam 30 which is measured by an energy monitor, which is not illustrated. Each of the first through fourth RF power sources 361~364 can supply discharge currents to the first through fourth amplifiers 351~354 according to the set values which are included in the input current setting signals. The first through fourth amplifiers 351~354 are capable of amplifying the pulsed laser beam 30 that enters each of the first through fourth amplifiers 351~354 according to the supplied discharge currents. Note that the hardware configuration of the control unit 330 will be described later with reference to FIG. 14.

With respect to the other configurations of the EUV light generating system 11, they may be the same as those of the EUV light generating system 11 illustrated in FIG. 1.

<4.2 Operation>

The operations related to laser oscillation by the laser apparatus 3 will be described along with the operations of the EUV light generating apparatus 1 which is employed with the laser apparatus 3. Descriptions of the operations of the EUV light generating system 11 of FIG. 2 which are the same as those of the EUV light generating system 11 illustrated in FIG. 1 will be omitted.

The EUV light generation control unit 5 may generate target supply signals based on the EUV light output command signals transmitted thereto from the exposure apparatus control unit 61 and output the generated target supply signals to the target supply unit 26. The target supply unit 26 is capable of outputting the droplets 271 to the plasma generation region 25 within the chamber 2 based on the target supply signals. The target sensor 4 can detect the droplets 271 which have been output to the interior of the chamber 2, and output droplet detection signals to the EUV light generation control unit 5. The EUV light generation control unit 5 may generate new target supply signals based on the EUV light output command signals and the droplet detection signals, and output the newly generated target supply signals to the target supply unit 26.

In addition, the EUV light generation control unit 5 may generate laser output signals based on the droplet detection signals which are output by the target sensor 4, and output the generated laser output signals to the control unit 330.

The control unit 330 may determine the delay times Dq1~Dq4 to be added to the trigger signals to be output to the first through fourth QCL's 311~314 based on the laser output signals. The control unit 330 may determine the delay times Dp1~Dp4 to be added to the drive signals to be output to the first through fourth optical switches 321, 322, 373, and 374 based on the laser output signals. The control unit 330 may determine the set values of excitation current which are included in the trigger signals to be output to the first through fourth QCL's 311~314, based on the laser output signals.

The control unit 330 may determine the set value of a discharge voltage which is included in the voltage setting signal to be output to the RF power source 380 based on the laser output signals. The control unit 330 may determine the set values of discharge currents which are included in the current setting signals to be output to the first through fourth RF power sources 361~364, based on the laser output signals.

The control unit 330 may output the voltage setting signal that includes the determined set value of the discharge voltage to the RF power source 380. The RF power source 380 is capable of supplying a discharge voltage to the discharge electrodes of the amplifier 375 of the regenerative amplifier 370 based on the input voltage setting signals. The control unit 330 may output the current setting signal that includes the determined set values of the discharge current to the first through fourth RF power sources 361~364. The first through fourth RF power sources 361~364 are capable of supplying discharge currents to discharge electrodes of each of the first through fourth amplifiers 351~354 based on the input current setting signals.

The control unit 330 may output trigger signals that include the determined set values of the excitation current to each of the first through fourth QCL'S 311~314, at timings which are delayed by delay times Dq1~Dq4 from the timing at which the laser output signals are input. Each of the first through fourth QC'S 311~314 can output pulsed laser beams based on the input trigger signals. The optical path adjustor 315 is capable of overlapping the optical paths of the pulsed laser beams which are output by the first through fourth QCL's 311~314 such that they practically become a single optical path, and outputting the overlapped pulsed laser beams to the first optical switch 321 as the pulsed laser beam 30.

The control unit 330 may output a drive signal for the first optical switch 321 to the first optical switch 321 at a timing which is delayed by the delay time Dp1 from the timing at which the laser output signals are input. The first optical switch 321 is capable of causing the incident pulsed laser beam 30 to pass therethrough based on the input drive signal, and outputting the pulsed laser beam 30 to the regenerative amplifier 370.

The control unit 330 may output a drive signal for the third optical switch 373 to the third optical switch 373 at a timing which is delayed by the delay time Dp3 from the timing at which the laser output signals are input. The third optical switch 373 is capable of changing the optical path of the pulsed laser beam 30 and guiding the pulsed laser beam 30 into the regenerative amplifier 370, based on the input drive signal. The pulsed laser beam 30 which has is introduced into the regenerative amplifier 370 reciprocates between the resonator mirrors 371 and 372, and is amplified each time that it passes through the amplifier 375.

The control unit 330 may output a drive signal for the fourth optical switch 374 to the fourth optical switch 374 at a timing which is delayed by the delay time Dp4 from the timing at which the laser output signals are input. The fourth optical switch 374 is capable of changing the optical path of the pulsed laser beam 30 and outputting the pulsed laser beam 30 from the regenerative amplifier 370 to the high reflectance mirror, based on the input drive signal. The high reflectance mirror is capable of reflecting the incident pulsed laser beam 30 and outputting the reflected pulsed laser beam 30 to the second optical switch 322.

The control unit 330 may output a drive signal for the second optical switch 322 to the second optical switch 322 at a timing which is delayed by the delay time Dp2 from the timing at which the laser output signals are input. The second optical switch 322 is capable of causing the incident pulsed laser beam 30 to pass therethrough based on the input drive signal, and outputting the pulsed laser beam to the first amplifier 351. Each of the first through fourth amplifiers 351~354 is capable of sequentially amplifying the pulsed laser beam 30. The pulsed laser beam 30 which is amplified by the fourth amplifier 354, which is the final amplifier, is output to the exterior of the laser apparatus as the pulsed laser beam 31.

The pulsed laser beam 31 which is output from the laser apparatus 3 is introduced to the interior of the chamber 2 as the pulsed laser beam 32, via the laser beam propagating direction control unit 34 and the window 21 of the EUV light generating apparatus 1. The pulsed laser beam 32 which is introduced to the interior of the chamber 2 can be focused at the plasma generation region 25 by the laser focusing mirror 22 as the pulsed laser beam 33. The pulsed laser beam 33 which is focused at the plasma generation region 25 is capable of irradiating the droplets 271 which are output to the plasma generation region 25 from the target supply unit 26. The droplets 271 can turn into plasma when irradiated by the pulsed laser beam 33, and emit light that includes the EUV light 251. The EUV light 251 can be selectively reflected by the EUV light collecting mirror 23, and output to the exposure apparatus 6 as the EUV light 252.

The other operations of the EUV light generating system 11 may be the same as those of the EUV light generating system 11 illustrated in FIG. 1.

<4.3 Optical Switch>

The detailed structures of the first and second optical switches 321 and 322 will be described with reference to FIG. 3A and FIG. 3B. The inner structures of the first and second optical switches 321 and 322 may be substantially the same as each other. The descriptions of FIG. 3A and FIG. 3B will be given for the first optical switch 321 as an example. FIG. 3A is a diagram for explaining the detailed structure of the first optical switch 321. FIG. 3B is a diagram for explaining the relationship between the timing at which the pulsed laser beam 30 enters a Pockels cell 321a and voltage applied to the Pockels cell 321a.

The first optical switch 321 may be constituted using electro-optical elements. The first optical switch 321 may include the Pockels cell 321a, a polarizer 321b, a polarizer 321c, and a power source 321d.

The polarizers 321b and 321c may cause specific linearly polarized components within the incident pulsed laser beam 30 to pass therethrough while other linearly polarized components are reflected thereby. The polarizers 321b and 321c may be provided to be substantially perpendicular with respect to the axis of the optical path of the incident pulsed laser beam 30. The polarizers 321b and 321c may be provided in a crossed Nicol state along the optical path of the incident pulsed laser beam 30. The polarizer 321b may cause the pulsed laser beam 30 which is linearly polarized in the Y direction to pass therethrough while the pulsed laser beam 30 which is linearly polarized in the X direction is reflected, for example. The polarizer 321c may cause the pulsed laser beam 30 which is linearly polarized in the X direction to pass therethrough while the pulsed laser beam 30 which is linearly polarized in the Y direction is reflected, for example.

A power source 321d may be a power source for applying voltage to the Pockels cell 321a. The power source 321d may apply voltage to the Pockels cell 321a such that an electric field is generated within the Pockels cell 321a in a direction substantially perpendicular to the propagating direction of the pulsed laser beam 30 that enters the Pockels cell 321a. The power source 321d may be connected to the control unit 330. Drive signals for the first optical switch 321 which are output by the control unit 330 may be input to the power source 321d. The power source 321d may apply voltages to the Pockels cell 321a at a voltage value, a pulse width, and an application timing of applied voltage which are specified by the input drive signals.

The Pockels cell 321a may be formed by a birefringent material. The Pockels cell 321a may be provided between the polarizers 321b and 321c. The Pockels cell 321a may be provided such that the surface thereof into which the pulsed laser beam 30 enters is substantially perpendicular to the axis of the optical path of the pulsed laser beam 30. The refractive index of the Pockels cell 321a may change according to applied voltage by the Pockels effect when voltage is applied by the power source 321d. The Pockels cell 321a may modulate the phase of the incident pulsed laser beam 30, and cause a phase difference (retardation) corresponding to the applied voltage to be generated in the pulsed laser beam 30. In the case that a half wavelength voltage is being applied by the power source 321d, the Pockels cell 321a may cause a phase difference $\pi$ to be generated with respect to the incident pulsed laser beam 30 which has passed through the polarizer 321b and is linearly polarized in the Y direction, to convert the direction of linear polarization of the pulsed laser beam 30 to the X direction. In the case that a voltage is not being applied by the power source 321d, the Pockels cell 321a may cause the incident pulsed laser beam 30 which has passed through the polarizer 321b and is linearly polarized in the Y direction to pass therethrough without converting the polarization state thereof.

The control unit 330 may output drive signals to the power source 321d such that voltage is applied to the Pockels cell 321a at timings synchronized with the timings at which the pulsed laser beam 30 enters the Pockels cell 321a. The control unit 330 may output drive signals to the power source 321d such that voltages having pulse widths capable of absorbing temporal jitters of the pulsed laser beam 30 are applied to the Pockels cell 321a. For example, in the case that the pulse width of the pulsed laser beam 30 is approximately 20 ns, the control unit 330 may output drive signals that cause the pulse width of applied voltages to become approximately 100 ns, as illustrated in FIG. 3B.

The pulsed laser beam 30 which has entered the first optical switch 321 can enter the polarizer 321b which is provided toward the upstream side. Components of the pulsed laser beam 30 that enter the polarizer 321b which are linearly polarized in the Y direction can pass through the polarizer 321b, and can enter the Pockels cell 321a as a pulsed laser beam 30 which is linearly polarized in the Y direction.

In the case that voltage is not being applied to the Pockels cell 321a, the pulsed laser beam 30 which is linearly polarized in the Y direction that enters the Pockels cell 321a can pass through the Pockels cell 321a with a linear polarization in the Y direction, and enter the polarizer 321c provided toward the downstream side. In this case, the pulsed laser beam 30 which is linearly polarized in the Y direction that enters the polarizer 321c is reflected by the polarizer 321c. Thereby, the pulsed laser beam 30 which is linearly polarized in the Y direction that enters the first optical switch 321 cannot pass through the first optical switch 321.

Similarly, in the case that voltage is not being applied to the Pockels cell 321a, light, such as returned light that enters the Pockels cell 321a from the downstream side and is linearly polarized in the X direction, passes through the Pockels cell 321a as light which is linearly polarized in the X direction, and enters the polarizer 321b provided at the upstream side. In this case, the light which is linearly polarized in the X direction that enters the polarizer 321b is reflected by the polarizer 321b. In addition, light, such as returned light that enters the first optical switch 321 from the downstream side and is linearly polarized in the Y direction, is reflected by the polarizer 321c.

On the other hand, in the case that a half wavelength voltage is being applied to the Pockels cell 321a, the pulsed laser beam 30 which is linearly polarized in the Y direction that enters the Pockels cell 321a is converted to the pulsed laser beam 30 which is linearly polarized in the X direction, and enters the polarizer 321c provided at the downstream side. In this case, the pulsed laser beam 30 which is linearly polarized in the X direction that enters the polarizer 321c passes through the polarizer 321c. Thereby, the pulsed laser beam 30 which is linearly polarized in the Y direction that enters the first optical switch 321 is converted to the pulsed laser beam 30 which is linearly polarized in the X direction, and can pass through the first optical switch 321.

As described above, the first optical switch 321 causes the pulsed laser beam 30 to pass therethrough by voltage being applied to the Pockels cell 321a at timings that match the incident timings of the pulsed laser beam 30. The first optical switch 321 prevents passage of returned light from the regenerative amplifier 370, etc., which are provided toward the downstream side of the first optical switch 321. That is, the first optical switch 321 has the function of an optical isolator. The second optical switch 322 operates on the same principle as that of the first optical switch 321, and also has the function of an optical isolator. Note that the first and second optical switches 321 and 322 may be constituted by electro-optical elements that include Kerr cells instead of Pockels cells. Alternatively, the first and second optical switches 321 and 322 may be constituted employing acousto-optical elements or magneto-optical elements instead of electro-optical elements.

<4.4 Regenerative Amplifier>

Figure 4:
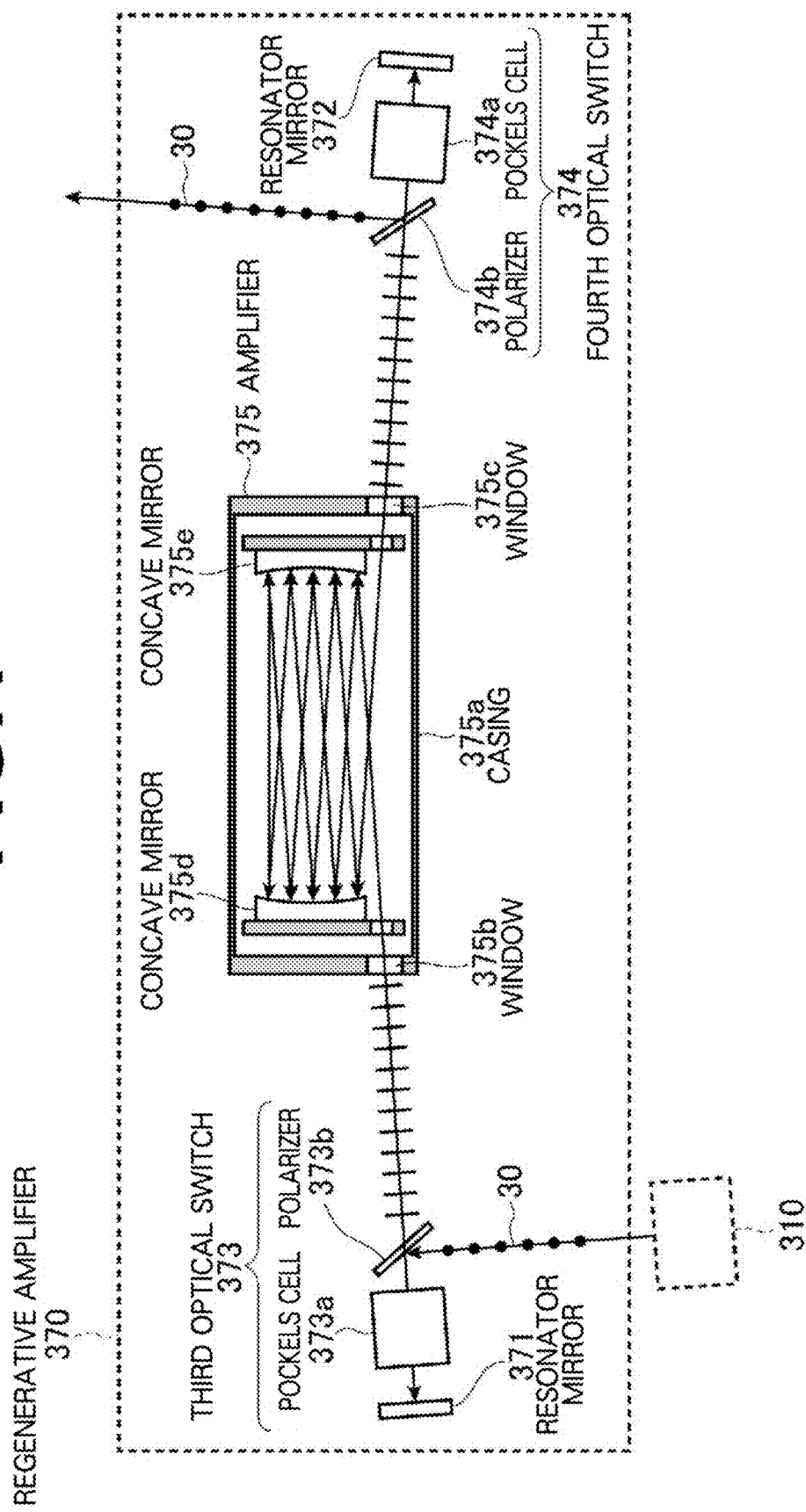
FIG. 4 is a diagram for explaining the detailed configuration of a regenerative amplifier.

The detailed structure of the regenerative amplifier 370 will be described with reference to FIG. 4. FIG. 4 is a diagram for explaining the detailed structure of the regenerative amplifier 370. As described above, the regenerative amplifier 370 may include the resonator mirror 371, the resonator mirror 372, the third optical switch 373, the fourth optical switch 374, and the amplifier 375.

The third optical switch 373 may be provided along the optical path of the pulsed laser beam 30 which has passed through the first optical switch 321 and entered the regenerative amplifier 370. The third optical switch 373 may be provided between the resonator mirror 371 and the amplifier 375. The third optical switch 373 may be constituted employing electro-optical elements. The third optical switch 373 may include a Pockels cell 373a, a polarizer 373b, and a power source (not shown).

The polarizer 373b may be provided along the optical path of the pulsed laser beam 30 which has entered the regenerative amplifier 370. The polarizer 373b may be provided to form an approximately 45 degree angle with the axis of the optical path of the pulsed laser beam 30 which has entered the regenerative amplifier 370. The polarizer 373b may be provided along the optical path of the pulsed laser beam 30 that reciprocates between the resonator mirrors 371 and 372. The polarizer 373b may transmit specific linearly polarized components of the pulsed laser beam 30 that enters the polarizer 373b, and reflect other linearly polarized components. As described above, the pulsed laser beam 30 that passes through the first optical switch 321 may be the pulsed laser beam 30 which is linearly polarized in a specific direction. The pulsed laser beam 30 that enters the regenerative amplifier 370 may be a pulsed laser beam 30 which is linearly polarized in the specific direction. The polarizer 373b may reflect the pulsed laser beam 30 which is linearly polarized in the specific direction and enters the regenerative amplifier 370, and transmit the pulsed laser beam 30 which is linearly polarized in a direction substantially perpendicular to the specific direction.

The power source (not shown) which is included in the third optical switch 373 may be a power source that applies voltage to the Pockels cell 373a. Drive signals for the third optical switch 373 which are output by the control unit 330 may be input to the power source. The power source may apply voltages to the Pockels cell 373a at a voltage value, a pulse width, and an application timing of applied voltage which are specified by the input drive signals. The other configurations of the power source may be the same as those of the power source 321d which is included in the first optical switch 321.

The Pockels cell 373a may be provided along the optical path of the pulsed laser beam 30 that reciprocates between the resonator mirrors 371 and 372. The Pockels cell 373a may be provided between the resonator mirror 371 and the polarizer 373b. In the case that voltage is being applied to the Pockels cell 373a from the power source (not shown), the Pockels cell 373a may generate a phase difference $\pi/2$ with respect to the incident linearly polarized pulsed laser beam 30 and convert the polarization of the pulsed laser beam 30 to a circular polarization. In addition, in the case that voltage is being applied to the Pockels cell 373a from the power source (not shown), the Pockels cell 373a may generate a phase difference $\pi/2$ with respect to an incident circularly polarized pulsed laser beam 30 and convert the polarization of the pulsed laser beam 30 to a linear polarization. In the case that voltage is not being applied to the Pockels cell 373a from the power source (not shown), the Pockels cell 373a may cause the incident linearly polarized pulsed laser beam 30 to pass without converting the polarization state thereof. The other configurations of the Pockels cell 373a may be the same as those of the Pockels cell 321a included in the first optical switch 321.

The fourth optical switch 374 may be provided along the optical path of the pulsed laser beam 30 that reciprocates between the resonator mirrors 371 and 372. The fourth optical switch 374 may be provided between the resonator mirror 372 and the amplifier 375. The fourth optical switch 374 may be constituted employing electro-optical elements. The fourth optical switch 374 may include a Pockels cell 374a, a polarizer 374b, and a power source (not shown).

The polarizer 374b may be provided along the optical path of the pulsed laser beam 30 that reciprocates between the resonator mirrors 371 and 372. The polarizer 374b may be provided to form an approximately 45 degree angle with the axis of the optical path of the pulsed laser beam 30 that reciprocates between the resonator mirrors 371 and 372. The polarizer 374b may transmit specific linearly polarized components of the pulsed laser beam 30 that enters the polarizer 374b, and reflect other linearly polarized components. The polarizer 374b may be provided in a parallel Nicol state with respect to the polarizer 373b included in the third optical switch 373.

The power source (not shown) included in the fourth optical switch 374 may be a power source for applying voltage to the Pockels cell 374a. Drive signals for the fourth optical switch 374 which are output by the control unit 330 may be input to the power source. The power source may apply voltages to the Pockels cell 374a at a voltage value, a pulse width, and an application timing of applied voltage which are specified by the input drive signals. The other configurations of the power source may be the same as those of the power source which is included in the third optical switch 373.

The Pockels cell 374a may be provided along the optical path of the pulsed laser beam 30 that reciprocates between the resonator mirrors 371 and 372. The Pockels cell 374a may be provided between the resonator mirror 372 and the polarizer 374b. The other configurations of the Pockels cell 374a may be the same as those of the Pockels cell 373a which is included in the third optical switch 373.

The amplifier 375 may be a slab amplifier. The amplifier 375 may be provided between the third optical switch 373 and the fourth optical switch 374. The amplifier 375 may include a pair of discharge electrodes (not shown), a casing 375a, a window 375b, a window 375c, a concave mirror 375d, and a concave mirror 375e.

The interior of the casing 375a may be filled with $CO_2$ gas, which is an amplification medium, in a gastight manner. The windows 375b and 375c may be provided in the side walls of the casing 375a. The windows 375b and 375c may guide the pulsed laser beam 30 that enters the amplifier 375 into the interior of the casing 375a. The windows 375b and 375c may guide the pulsed laser beam 30 output from the amplifier 375 to the exterior of the casing 375a.

The pair of discharge electrodes may be provided within the interior of the casing 375a. Each of the pair of discharge electrodes may be formed to be substantially plate shaped. Each of the pair of discharge electrodes may be provide to face each other, separated from each other by a predetermined distance. Each of the pair of discharge electrodes may be provided to be substantially parallel to the axis of the optical path of the pulsed laser beam 30 that enters the amplifier 375. In the example illustrated in FIG. 4, each of the pair of discharge electrodes may be provided to be substantially parallel to the drawing sheet of FIG. 4. A discharge space is formed between the pair of discharge electrodes. Each of the pair of electrodes may be cooled by a cooling apparatus (not shown). One of the pair of discharge electrodes may be grounded, and the other of the pair of discharge electrodes may be connected to the RF power source 380. A high frequency discharge voltage may be supplied between the pair of discharge electrodes by the RF power source 380. When the discharge voltage is supplied between the pair of discharge electrodes, the $CO_2$ gas that fills the discharge space between the pair of discharge electrodes is excited. Thereby, the energy is imparted to the pulsed laser beam 30 that enters the amplifier 375 as it passes through the discharge space, and the pulsed laser beam 30 is amplified.

The concave mirror 375d and the concave mirror 375e may be provided within the interior of the casing 375a. The concave mirror 375d and the concave mirror 375e may be provided such that the discharge space formed between the pair of discharge electrodes is interposed therebetween. The concave mirror 375d and the concave mirror 375e may be confocal cylindrical mirrors. The concave mirror 375d and the concave mirror 375e may reflect the pulsed laser beam 30 that enters the amplifier 375 a plurality of times in multiple passes. Thereby, the pulsed laser beam 30 can be multipass amplified within the discharge space formed between the pair of discharge electrodes. Note that the amplifier 375 may be a three axis orthogonal amplifier or a high speed axial flow amplifier.

The pulsed laser beam 30 that enters the regenerative amplifier 370 may be the pulsed laser beam 30 which is linearly polarized in the specific direction. The pulsed laser beam 30 enters the polarizer 373b. The pulsed laser beam 30 that enters the polarizer 373b is reflected by the polarizer 373b and enters the Pockels cell 373a in the linearly polarized state. Here, the control unit 330 may output drive signals to the power source of the third optical switch 373 such that voltage is applied to the Pockels cell 373a at timings synchronized with the timings at which the pulsed laser beam 30 enters the Pockels cell 373a. In the case that voltage is being applied to the Pockels cell 373a, the linearly polarized pulsed laser beam 30 that enters the Pockels cell 373a is converted to a circularly polarized pulsed laser beam 30 as it passes through the Pockels cell 373a, and enters the resonator mirror 371. The pulsed laser beam 30 that enters the resonator mirror 371 is reflected by the resonator mirror 371 and reenters the Pockels cell 373a while maintaining the circular polarization thereof.

The circularly polarized pulsed laser beam 30 that reenters the Pockels cell 373a is converted to a linearly polarized pulsed laser beam 30 as it passes through the Pockels cell 373a again. At this time, the pulsed laser beam 30 that passes through the Pockels cell 373a again is converted to linearly polarized pulsed laser beam with a polarization direction substantially perpendicular to the polarization direction of the pulsed laser beam 30 that entered the regenerative amplifier 370. The linearly polarized pulsed laser beam 30 which has passed through the Pockels cell 373a again reenters the polarizer 373b. The pulsed laser beam 30 that reenters the polarizer 373b is transmitted through the polarizer 373b, and enters the amplifier 375 while maintaining the linear polarization thereof. Here, the control unit 330 may cease output of the drive signals to the third optical switch 373 such that voltage is not applied to the Pockels cell 373a after the pulsed laser beam 30 passes through the Pockels cell 373a again.

The pulsed laser beam 30 that enters the amplifier 375 enters the interior of the casing 375a via the window 375b. The pulsed laser beam 30 that enters the interior of the casing 375a is reflected a plurality of times by the concave mirrors 375d and 375e within the discharge space formed between the pair of discharge electrodes and is multipass amplified. The multipass amplified pulsed laser beam 30 is output from the amplifier 375 via the window 375c while maintaining the linear polarization thereof. The polarization direction of the linearly polarized pulsed laser beam 30 which is output from the amplifier 375 is substantially perpendicular to the polarization direction of the pulsed laser beam 30 that entered the regenerative amplifier 370.

The pulsed laser beam 30 output from the amplifier 375 enters the polarizer 374b. The pulsed laser beam 30 that enters the polarizer 374b is transmitted through the polarizer 374b and enters the Pockels cell 374a while maintaining the linear polarization thereof. Here, the control unit 330 may not output drive signals to the power source of the fourth optical switch 374 such that voltage is not applied to the Pockels cell 374a when the pulsed laser beam 30 enters the Pockels cell 374a. In the case that voltage is not being applied to the Pockels cell 374a, the linearly polarized pulsed laser beam 30 that enters the Pockels cell 374a passes through the Pockels cell 374a as is, and enters the resonator mirror 372. The pulsed laser beam 30 that enters the resonator mirror 372 is reflected by the resonator mirror 372 and passes through the Pockels cell 374a while maintaining the linear polarization thereof. The linearly polarized pulsed laser beam 30 which has passed through the Pockels cell 374a again enters the polarizer 374b again. The pulsed laser beam 374b which has reentered the polarizer 374a is transmitted through the polarizer 374b and reenters the amplifier 375 while maintaining the linear polarization thereof.

The pulsed laser beam 30 that reenters the amplifier 375 is multipass amplified in the same manner as that described above, and is output from the amplifier 375 again. The polarization direction of the linearly polarized pulsed laser beam 30 which is output from the amplifier 375 again remains substantially perpendicular to the polarization direction of the pulsed laser beam 30 that entered the regenerative amplifier 370. The pulsed laser beam 30 which is output from the amplifier 375 again passes through the polarizer 373b and the Pockels cell 373a, and is reflected by the resonator mirror 371.

During a time when voltage is not being applied to the Pockels cells 373a and 374a, the pulsed laser beam 30 is capable of passing through the Pockels cells 373a and 374a, the polarizers 373b and 374b, and reciprocating between the resonator mirrors 371 and 372 while being amplified by the amplifier 375.

Thereafter, the control unit 330 may output drive signals to the power source of the fourth optical switch 374 such that voltage is applied to the Pockels cell 374a at a timing synchronized with the timing at which that the pulsed laser beam 30 output from the amplifier 375 enters the Pockels cell 374a. In the case that voltage is being applied to the Pockels cell 374a, the linearly polarized pulsed laser beam 30 that enters the Pockels cell 374a is converted to a circularly polarized pulsed laser beam 30 when passing through the Pockels cell 374a, and enters the resonator mirror 372. The pulsed laser beam 30 that enters the resonator mirror 372 is reflected by the resonator mirror 372 and enters the Pockels cell 374a again while maintaining the circular polarization thereof. The circularly polarized pulsed laser beam 30 that reenters the Pockels cell 374a is converted to a linearly polarized pulsed laser beam 30 when passing through the Pockels cell 374a again. At this time, the pulsed laser beam 30 that passes through the Pockels cell 374a again is converted to a linearly polarized pulsed laser beam 30 with a polarization direction which is substantially parallel to the polarization direction of the linearly polarized pulsed laser beam 30 that entered the regenerative amplifier 370. The linearly polarized pulsed laser beam 30 that passes through the Pockels cell 374a again reenters the polarizer 374b. The pulsed laser beam 30 that reenters the polarizer 374b is reflected by the polarizer 374b and is output from the regenerative amplifier 370.

As described above, the regenerative amplifier 370 amplifies the pulsed laser beam 30 that enters thereinto and outputs the amplified pulsed laser beam 30 at specific timings, under control of the control unit 330. The amplified pulsed laser beam 30 output from the regenerative amplifier 370 enters the second optical switch 322 via the high reflectance mirror.

<4.5 Quantum Cascade Laser>

Figure 5:
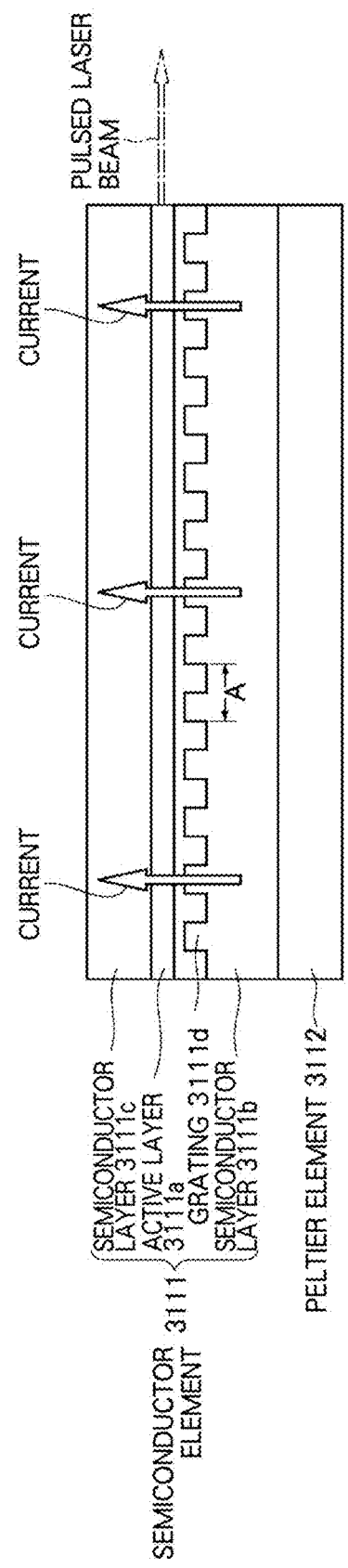
FIG. 5 is a diagram for explaining the detailed configuration of a first QCL.

The detailed structure of the first through fourth QCL's 311~314 will be described with reference to FIG. 5. The inner structures of the first through fourth QCL's 311~314 may be substantially the same as each other. The description of FIG. 5 will be given for the first QCL 311 as an example. FIG. 5 is a diagram for explaining the detailed structure of the first QCL 311.

The first QCL 311 may be a distributed feedback quantum cascade laser. The first QCL 311 may include a semiconductor element 3111 and a Peltier element 3112.

The semiconductor element 3111 may be a semiconductor element that generates light by utilizing electron transitions between sub bands of a quantum well structure. The semiconductor element 3111 may include an active layer 3111a, a semiconductor layer 3111b, and a semiconductor layer 3111c. The semiconductor element 3111 may be of a layered structure in which the semiconductor layer 3111b, the active layer 3111a, and the semiconductor layer 3111c are laminated in this order.

The active layer 3111a may have a function of generating and amplifying light. The active layer 3111a may be of a cascade structure in which quantum well layers which are employed to generate light and injection layers that inject electrons into the quantum well layers are alternately laminated.

The semiconductor layers 3111b and 3111c may be provided to sandwich the active layer 3111a from both sides thereof in the laminating direction of the semiconductor element 3111. The semiconductor layers 3111b and 3111c may include guide layers for waveguiding light which is generated at the active layer 3111a, cladding layers for trapping the light, etc. A grating 3111d, in which a plurality of grooves are formed at a predetermined groove interval A, may be provided in the semiconductor layer 3111b in the vicinity of the active layer 3111a.

The grating 3111d is capable of functioning as an optical resonator that selectively feeds back light in the vicinity of a specific wavelength corresponding to the predetermined groove interval A. When gain exceeds a threshold value, the amount of fed back light increases drastically, and the light in the vicinity of the specific wavelength is output from one end or both ends of the active layer 3111a as a laser beam. Note that a portion of the grooves that constitute the grating 3111d may be formed at intervals other than the predetermined groove interval A. The grooves which are formed at intervals other than the predetermined groove interval A may be formed at one or a plurality of predetermined locations in the output direction of the pulsed laser beam. Generally, in distributed feedback lasers, if the grooves of a grating are formed at uniform intervals, pulsed laser beams having two wavelengths are ideally oscillated. In contrast, in the case that a portion of the grooves of the grating 3111d are formed at intervals other than the predetermined groove interval A, the first QCL 311 will be capable of oscillating a pulsed laser beam having a single wavelength.

A pair of electrode layers (not shown) may be provided on the semiconductor layers 3111b and 3111c such that the semiconductor element 3111 is sandwiched therebetween from both sides in the laminating direction thereof. The pair of electrode layers may be connected to the control unit 330 via a current controller (not shown). Excitation current according to the trigger signals which are output from the control unit 330 may be supplied to the pair of electrode layers by the current controller. Thereby, excitation current according to the trigger signals is capable of flowing in the semiconductor layer 3111b, the semiconductor layer 3111c, and the active layer 3111a which are held between the pair of electrode layers.

The Peltier element 3112 may be an element for cooling the semiconductor element 3111. The Peltier element 3112 may be connected to the control unit 330. The Peltier element 3112 may cool the semiconductor element 3111 under control of the control unit 330.

When a trigger signal is input to the first QCL 311 from the control unit 330, excitation current flows in the active layer 3111a of the first QCL 311. If the excitation current flows in the active layer 3111a, the active layer 3111a can generate light. The wavelength of the generated light is selected by the grating 3111d, is amplified each time that it passes through the active layer 3111a, and can oscillate. Then, the light is output from a facet of the semiconductor element 3111 as a pulsed laser beam. The first QCL 311 is capable of outputting a pulsed laser beam under control of the control unit 330 in this manner. Note that the oscillating wavelength of the first QCL 311 depends on the optical path length of an optical resonator within the semiconductor element 3111 and the selected wavelength of the grating 3111d. The second through fourth QCL's 312~314 each operate on the same principle as that of the first QCL 311, and are capable of outputting pulsed laser beams.

Figure 6:
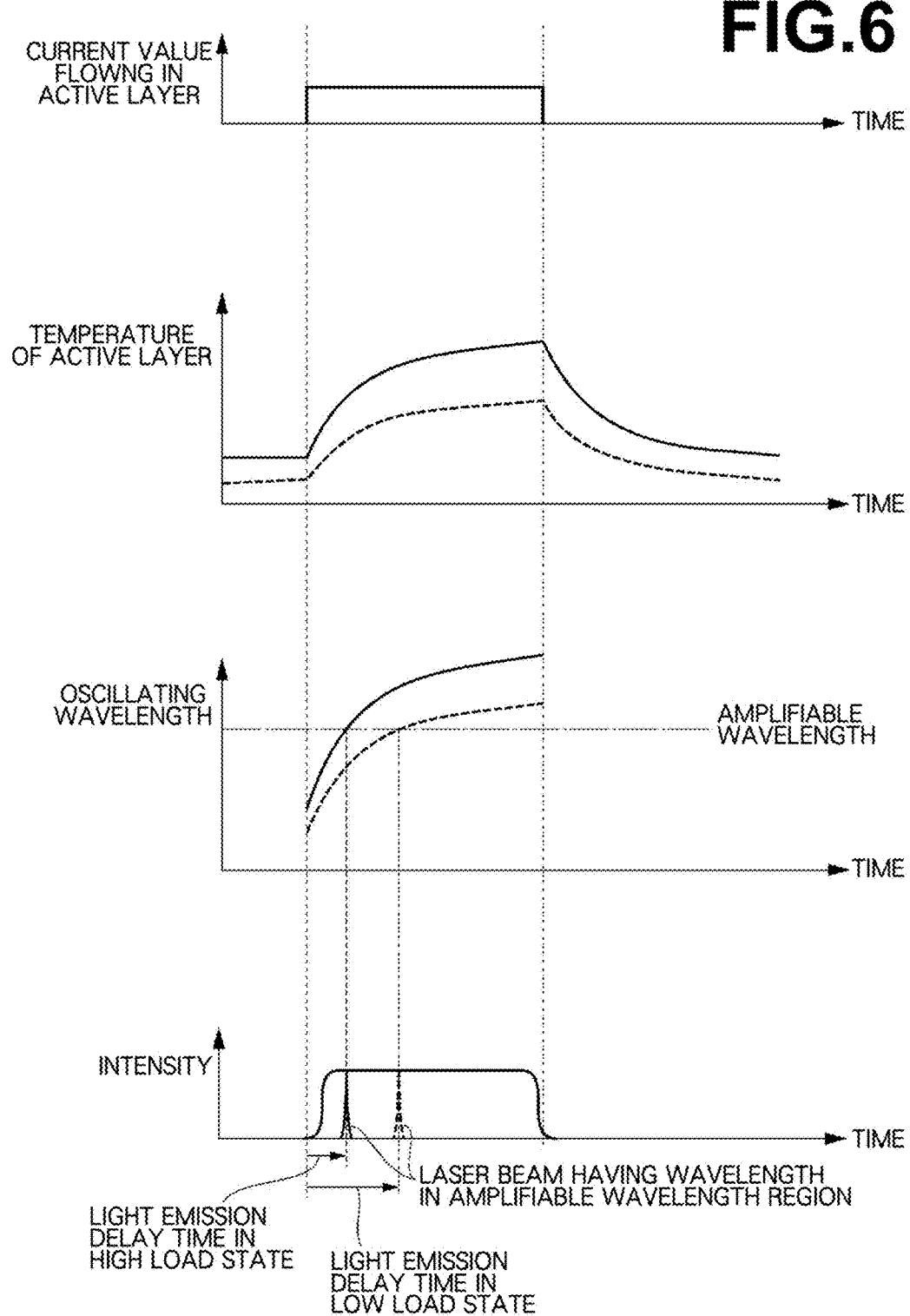
FIG. 6 is a diagram for explaining wavelength chirping which is generated at the first QCL.

Wavelength chirping of the first through fourth QCL's 311~314 will be described with reference to FIG. 6. Wavelength chirping can occur in a similar manner in each of the first through fourth QCL's 311~314. The description of FIG. 6 will be given for the first QCL 311 as an example. FIG. 6 is a diagram for explaining wavelength chirping which is generated at the first QCL 311.

When excitation current is supplied to the first QCL 311 and laser oscillation occurs, heat generated by the semiconductor element 3111 included in the first QCL 311 causes the temperature of the active layer 3111a of the semiconductor element 3111 to increase, as illustrated in FIG. 6. The refractive index of the active layer 3111a may change if the temperature of the active layer 3111a changes. Further, the optical path length of the optical resonator within the semiconductor element 3111 and the interval A among the grooves of the grating 3111d may change if the temperature of the active layer 3111a changes. Thereby, the oscillating wavelength of the first QCL 311 may change as illustrated in FIG. 6.

The semiconductor element 3111 of the first QCL 311 may be cooled by the Peltier element 3112. Therefore, the temperature of the active layer 3111a is permanently maintained to be substantially constant by thermal equilibrium of heat generation by the semiconductor element 3111 and cooling by the Peltier element 3112. However, the temperature of the active layer 3111a transitionally changes as follows. That is, the temperature of the active layer 3111a increases drastically immediately after the excitation current is supplied to the first QCL 311, then increases gradually as time passes, the temperature of the active layer 3111a decreases drastically when the supply of the excitation current is ceased, then decreases gradually as time passes, as illustrated in FIG. 6. At this time, the refractive index of the active layer 3111a and the optical path length of the optical resonator within the semiconductor element 3111 may increase accompanying the increase in the temperature of the active layer 3111a. As a result, the oscillating wavelength of the first QCL 311 may also increase. This phenomenon, in which the oscillating wavelengths of semiconductor lasers that include QCL's change, is referred to as wavelength chirping. The wavelength of the pulsed laser beam which is output from the first QCL 311 may change due to wavelength chirping.

Meanwhile, the wavelength regions of the pulsed laser beam 30 which are capable of being amplified by the regenerative amplifier 370 and the first through fourth amplifiers 351~354 may be determined in advance by the amplification media of these amplifiers. For this reason, the pulsed laser beam which is output from the first QCL 311 will be appropriately amplified only in cases that it has a wavelength within an the amplifiable wavelength regions of these amplifiers. In the case that the oscillating wavelength of the first QCL 311 changes due to wavelength chirping, the pulsed laser beam which is output from the first QCL 311 will only be appropriately amplified at a timing at which the wavelength of the pulsed laser beam reaches the amplifiable wavelength region. In other words, only the pulsed laser beam which is output from the first QCL 311 at the timing at which the wavelength of the pulsed laser beam reaches the amplifiable wavelength region will be appropriately amplified. That is, a time lag may be generated between the timing at which the excitation current is supplied to the first QCL 311 and the timing at which the wavelength of the output pulsed laser beam reaches the amplifiable wavelength region. That is, a time lag may be generated between the timing at which a trigger signal is output to the first QCL 311 and the timing at which a pulsed laser beam having a wavelength within the amplifiable wavelength region is output from the first QCL 311. In the present disclosure, the time lag between the timing at which a trigger signal is output to a QCL and the timing at which a pulsed laser beam having a wavelength within the amplifiable wavelength region is output will also be referred to as a "light emission delay time" of the QCL.

The wavelengths of pulsed laser beams which are output from the second through fourth QCL's 312~314 may also change due to wavelength chirping in the same manner as the first QCL 311. Therefore, light emission delay times may be generated in the second through fourth QCL's 312~314 in the same manner as the first QCL 311.

The light emission delay times of each of the first through fourth QCL's 311~314 may vary depending on the load state of each of the first through fourth QCL's 311~314 as well. For example, the behavior of the first QCL 311 in a high load state with a repetition frequency of 100 kHz and the behavior of the first QCL 311 in a low load state with a repetition frequency of 20 kHz will be compared and described. In FIG. 6, the temperature of the active layer, etc. of the first QCL 311 in a high load state are indicated by solid lines, and the temperature of the active layer, etc. of the first QCL 311 in a low load state are indicated by broken lines.

The number of times that excitation current is supplied per unit time to the first QCL 311 in a high load state that oscillates at a high repetition frequency is greater than that for the first QCL 311 in a low load state that oscillates at a low repetition frequency. For this reason, the temperature of the active layer 3111a of the first QCL 311 may be higher in a high load state that oscillates at a high repetition frequency than in a low load state that oscillates at a low repetition frequency. Along with this difference due to the load state, the oscillating wavelength of the first QCL 311 immediately after excitation current is supplied may be shifted toward the longer wavelength side in a high load state than in a low load state. Further, the range of variation of the oscillating wavelength of the first QCL 311 due to wavelength chirping will be greater in a high load state than in a low load state. As a result, the light emission delay time of the first QCL 311 may be shorter in a high load state than in a low load state. That is, the timing at which a pulsed laser beam having a wavelength within the amplifiable wavelength region may be faster in a high load state than in a low load state. The timing at which a pulsed laser beam having a wavelength within the amplifiable wavelength region may be faster in a high load state than in a low load state in the second through fourth QCL's 312~314 as well, in the same manner as in the first QCL 311. In this manner, the timing at which pulsed laser beams having wavelengths within the amplifiable wavelength region by each of the first through fourth QCL's 311~314 may vary depending on the load state of each of the QCL's. The delay times Dq1 through Dq4 which are added to the trigger signals are determined in advance such that pulsed laser beams 30 having wavelengths within the amplifiable wavelength region are output at substantially the same timing, taking the light emission delay time of each of the first through fourth QCL's 311~314 into consideration.

5. Objective

In the laser apparatus 3, it is necessary to synchronize the timings at which pulsed laser beams within the amplifiable wavelength region are output from the first through fourth QCL's 311~314 and the timings at which the first through fourth optical switches 321, 322, 372, and 374 are driven.

However, there may be cases in which these timings will not be synchronized, if the operating conditions of the laser apparatus 3 are changed.

For example, a case, in which the repetition frequency of the pulsed laser beam 31 to be output from the laser apparatus 3 is decreased by a command from the exposure apparatus 6 or the like, is possible. In this case, the load states of the first through fourth QCL's 311~314 will decrease, and the timings at which pulsed laser beams within the amplifiable wavelength region are output from the first through fourth QCL's 311~314 will become later. Thereby, the timings at which pulsed laser beams within the amplifiable wavelength region are output from the first through fourth QCL's 311~314 and the timings at which the first through fourth optical switches 321, 322, 372, and 374 are driven will no longer be synchronized. As a result, the pulsed laser beams output from any of the first through fourth QCL's 311~314 may not be appropriately amplified. In addition, the pulsed laser beam 30 may not pass through any of the first through fourth optical switches 321, 322, 372, and 374.

Accordingly, there is demand for technology that enables the pulsed laser beam 30 to be appropriately amplified even if the operating conditions of the laser apparatus 3 are changed, such that a pulsed laser beam 31 having desired properties can be output at desired timings. Note that changing the cooling operations of the Peltier element 3112 according to changes in the operation conditions of the laser apparatus 3 may be considered. However, it is difficult to suppress transitional temperature changes of the active layer 3111a only by changing the cooling operations of the Peltier element 3112. That is, it is difficult to compensate for wavelength chirping.

6. EUV Light Generating System Including Laser Apparatus According to First Embodiment <6.1 Configuration>

Figure 7:
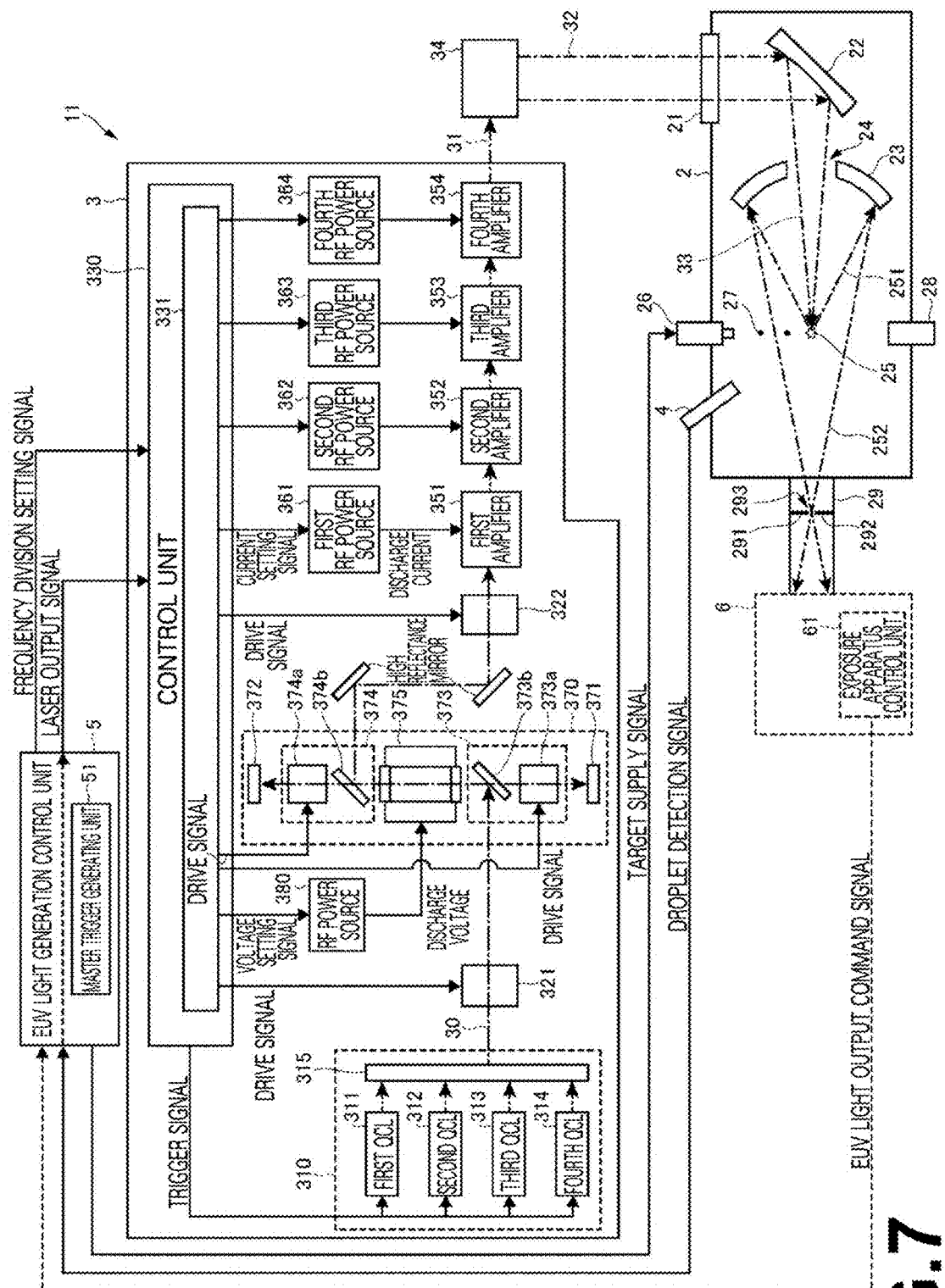
FIG. 7 is a diagram that illustrates the configuration of an EUV light generating system including a laser apparatus according to a first embodiment.

The configuration of an EUV light generating system 11 that includes a laser apparatus 3 according to a first embodiment will be described with reference to FIG. 7 and FIG. 8. FIG. 7 is a diagram that illustrates the configuration of the EUV light generating system 11 including the laser apparatus 3 according to the first embodiment. The configurations of the EUV light generation control unit 5 and the control unit 330 of the EUV light generating system 11 including the laser apparatus 3 of the first embodiment may be different from those of the EUV light generating system 11 illustrated in FIG. 2. Descriptions of components of the EUV light generating system 11 of the first embodiment which are the same as those of the EUV light generating system 11 illustrated in FIG. 2 will be omitted.

The EUV light generation control unit 5 of FIG. 7 may include a master trigger generating unit 51. The master trigger generating unit 51 may determine the target repetition frequency of the droplets 271 to be the master repetition frequency, regardless of the target repetition frequency of the EUV light 252 included in the EUV light output command signals. The master repetition frequency may be a repetition frequency having a constant value which is set in advance, based on the specifications of the EUV light generating apparatus 1, the laser apparatus 3, or the exposure apparatus 6. The master repetition frequency may be a repetition frequency which is the upper limit of possible target repetition frequencies of the EUV light 252 included in the EUV light output command signals. The master repetition frequency may be an integer multiple of the target repetition frequency of the EUV light 252. For example, the master repetition frequency may be 100 kHz, and the target repetition frequency of the EUV light 252 may be 100 Hz, 50 kHz, 33.3 kHz, 25 kHz, 20 kHz, 10 kHz, 1 kHz, etc.

The EUV light generation control unit 5 may generate the target supply signals with the master repetition frequency determined by the master trigger generating unit 51 as the target repetition frequency of the droplets 271. The EUV light generation control unit 5 may output the generated target supply signals at the master repetition frequency to the target supply unit 26. The target supply unit 26 may generate and output the droplets 271 at the master repetition frequency. The target sensor 4 detects the droplets 271 which are output at the master repetition frequency, and outputs droplet detection signals to the EUV light generation control unit 5. Droplet detection signals that reflect the master repetition frequency are output to the EUV light generation control unit 5.

The EUV light generation control unit 5 may generate and output laser output signals to the control unit 330, based on the droplet detection signals that reflect the master repetition frequency. Specifically, the EUV light generation control unit 5 may output laser output signals for each pulse to the control unit 330 at timings which are synchronized with the timings at which the droplet detection signals for the droplets 271 which are output at the master repetition frequency are input thereto. The laser output signals that reflect the master repetition frequency are input to the control unit 330.

Note that the EUV light generation control unit 5 may output various target values for the pulsed laser beam 31, such as the target pulse energy, to the control unit 330 separately, without including these target values in the laser output signals. In this case, the EUV light generation control unit 5 may output the droplet detection signals for the droplets 271 which are output at the master repetition frequency themselves to the control unit 330 as the laser output signals. The EUV light generation control unit 5 may output various target values for the pulsed laser beam 31, such as the target pulse energy, to the control unit 330 prior to outputting the laser output signals. The control unit 330 may determine the set value for the excitation current, included in the trigger signals, the set value for the discharge voltage included in the voltage setting signals, and the set value for the discharge current included in the current setting signals prior to input of the laser output signals.

In addition, the EUV light generation control unit 5 may generate and output frequency division setting signals to the control unit 330. The EUV light generation control unit 5 may output the frequency division setting signals to the control unit 330 prior to outputting the laser output signals. The frequency division setting signals may be control signals for setting the frequency division ratio when dividing the master repetition frequency within the control unit 330. The frequency division ratio may be a value which is calculated by dividing the value of the master repetition frequency by the target repetition frequency of the EUV light 252 included in the EUV light output command signals.

The control unit 330 of FIG. 7 may include a frequency divider 331. The frequency divider 331 may divide the frequency of the laser output signal output from the EUV light generation control unit 5 based on the frequency division setting signals output from the EUV light generation control unit 5. The frequency divider 331 may divide the frequency of the laser output signals, which are input at substantially the same repetition frequency as the master repetition frequency, employing the frequency division ratio included in the frequency division setting signals. The repetition frequency of the laser output signals which are divided will be substantially the same repetition frequency as the target repetition frequency of the EUV light 252 included in the EUV light output command signals. The repetition frequency of the laser output signals which are not divided will be substantially the same repetition frequency as the master repetition frequency.

The control unit 330 may output drive signals to the optical switches, voltage setting signals to the RF power source 380, and current setting signals to the first through fourth RF power sources 361~364 based on the laser output signals, of which the frequency has been divided. The control unit 330 may output the drive signals to the optical switches, the voltage setting signals, and the current setting signals at substantially the same repetition frequency as the target repetition frequency of the EUV light 252, synchronized with the timings at which the laser output signals are input. The control unit 330 may output each of the drive signals for the optical switches, the voltage setting signals, and the current setting signals directly from the frequency divider 331. The first and second optical switches 321 and 322 cause incident pulsed laser beams 30 to pass therethrough at a repetition frequency which is substantially the same as the target repetition frequency of the EUV light 252, at timings synchronized with the timings at which the laser output signals are input to the control unit 330. The third and fourth optical switches 373 and 374 change the optical paths of incident pulsed laser beams 30 at a repetition frequency which is substantially the same as the target repetition frequency of the EUV light 252, at timings synchronized with the timings at which the laser output signals are input to the control unit 330. The amplifier 375 of the regenerative amplifier 370 amplifies and outputs the pulsed laser beam 30 at a repetition frequency which is substantially the same as the target repetition frequency of the EUV light 252, at timings synchronized with the timings at which the laser output signals are input to the control unit 330. The first through fourth amplifiers 351~354 amplify and output the pulsed laser beam 30 at a repetition frequency which is substantially the same as the target repetition frequency of the EUV light 252, at timings synchronized with the timings at which the laser output signals are input to the control unit 330.

In addition, the control unit 330 may output trigger signals to the first through fourth QCL's 311~314 based on the laser output signals, of which the frequency has not been divided. The control unit 330 may output the trigger signals at a repetition frequency which is substantially the same as the master repetition frequency, at timings synchronized with the timings at which the laser output signals are input thereto. At this time, the control unit 330 may output the trigger signals at timings delayed by the predetermined delay times Dq1~Dq4 from the timings at which the laser output signals are input thereto. Each of the first through fourth QCL's 311~314 are capable of outputting pulsed laser beams at a repetition frequency which is substantially the same as the master repetition frequency, at timings synchronized with the timings at which the laser output signals are input to the control unit 330.

The other configurations of the EUV light generating system 11 that includes the laser apparatus 3 of the first embodiment may be the same as those of the EUV light generating system 11 illustrated in FIG. 2.

<6.2 Operation>

Figure 8:
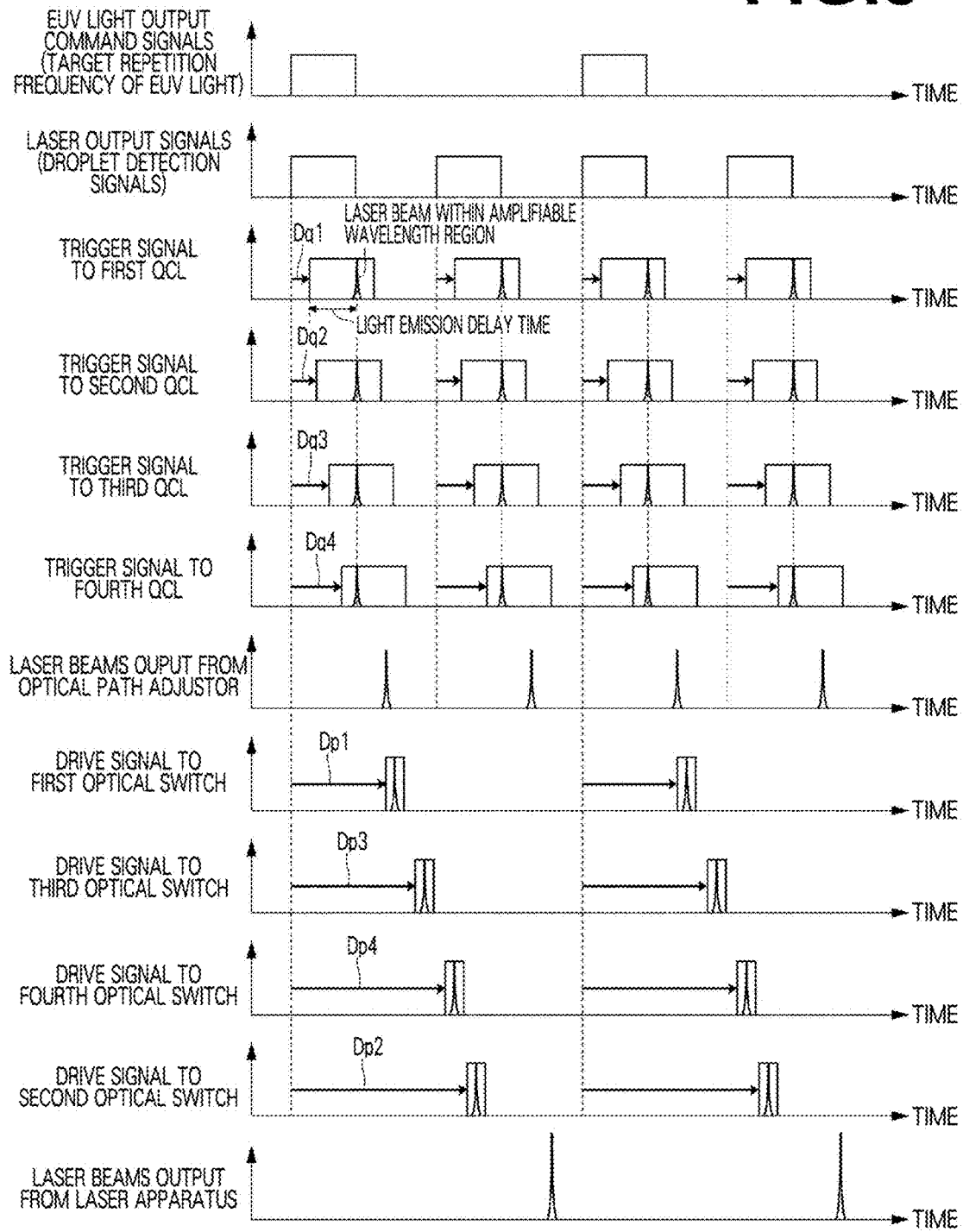
FIG. 8 is a diagram for explaining operations related to laser oscillation in the EUV light generating system including the laser apparatus according to the first embodiment.

FIG. 8 is a diagram for explaining the operations related to laser oscillation in the EUV light generating system 11 that includes the laser apparatus 3 of the first embodiment. Descriptions of the operations of the EUV light generating system 11 that includes the laser apparatus 3 of the first embodiment which are the same as those of the EUV light generating system 11 illustrated in FIG. 2 will be omitted.

EUV light output command signals may be transmitted from the exposure apparatus control unit 61 to the EUV light generation control unit 5. The EUV light generation control unit 5 may output various target values such as the target pulse energy of the pulsed laser beam 31 to the control unit 330, based on various target values such as the target pulse energy of the EUV light 252 included in the EUV light output command signals. The control unit 330 may determine the set values for excitation currents to be set for the first through fourth QCL's 311~314, based on various target values such as the target pulse energy of the pulsed laser beam 31 output from the EUV light generation control unit 5. The control unit 330 may determine set values for discharge voltages to be included in the voltage setting signals to be output to the RF power source 380, based on various target values such as the target pulse energy of the pulsed laser beam 31. The control unit 330 may determine set values for discharge currents to be included in the current setting signals to be output to the first through fourth RF power sources 361~364, based on various target values such as the target pulse energy of the pulsed laser beam 31.

The EUV light generation control unit 5 may generate frequency division setting signals employing the target repetition frequency of the EUV light 252 included in the EUV light output command signals and the master repetition frequency, and output the generated frequency division setting signals to the control unit 330. The target repetition frequency of the EUV light 252 may be 50 kHz, for example. The master repetition frequency may be 100 kHz, for example. In this example, the frequency division ratio included in the frequency division setting signals will be 2.

The EUV light generation control unit 5 may generate target supply signals having the master repetition frequency as the target repetition frequency of the droplets 271, and output the generated target supply signals to the target supply unit 26. The target supply unit 26 generates the droplets 271 at the master repetition frequency and output the generated droplets 271 into the chamber 2. The target sensor 4 outputs droplet detection signals for the droplets 271 which are output at the master repetition frequency to the EUV light generation control unit 5. The EUV light generation control unit 5 may output the droplet detection signals that reflect the master repetition frequency themselves to the control unit 330 as the laser output signals.

The control unit 330 may determine the delay times Dq1~Dq4 to be added to the trigger signals based on the laser output signals, of which the frequency is not divided. The control unit 330 may divide the frequency of the laser output signals based on the frequency division setting signals. The control unit 330 may determine the delay times Dp1~Dp4 to be added to the drive signals for the optical switches based on the laser output signals, of which the frequency has been divided.

The control unit 330 may output the trigger signals that include the set values for excitation currents, which are determined in advance, to the first through fourth QCL's 311~314, at timings delayed from the timings, at which the laser output signals of which the frequency has not been divided are input, by the delay times Dq1~Dq4. Each of the first through fourth QCL's 311~314 are capable of outputting pulsed laser beams based on the input trigger signals. At this time, each of the first through fourth QCL's 311~314 is capable of outputting pulsed laser beams 30 having wavelengths within the amplifiable wavelength region, at a repetition frequency that reflects the master repetition frequency, which is an integer multiple of the target repetition frequency of the EUV light 252. The optical path adjustor 315 overlaps the optical paths of the pulsed laser beams output from each of the first through fourth QCL's 311~314 to practically form a single optical path, and outputs the overlapped pulsed laser beams to the first optical switch 321 as the pulsed laser beam 30.

The control unit 330 may output the voltage setting signals that include set values for discharge voltages, which are set in advance, to the RF power source 380 at timings synchronized with the timings at which the laser output signals, of which the frequency is divided, are input thereto. The RF power source 380 is capable of supplying discharge voltages to the discharge electrodes of the amplifier 375 of the regenerative amplifier 370, based on the input voltage setting signals. The control unit 330 may output the current setting signals that include set values for discharge currents, which are set in advance, to the first through fourth RF power sources 361~364 at timings synchronized with the timings at which the laser output signals, of which the frequency has been divided, are input thereto. The first through fourth RF power sources 361~364 are capable of supplying discharge currents to the discharge electrodes of each of the first through fourth amplifiers 351~354, based on the input current setting signals.

The control unit 330 may output the drive signals for the first optical switch 321 to the first optical switch 321 at timings delayed by the delay time Dp1 from the timings at which the laser output signals, of which the frequency has been divided, are input thereto. The first optical switch 321 selectively passes the incident pulsed laser beam 30 therethrough based on the input drive signals, and outputs the pulsed laser beam 30 which has passed therethrough to the regenerative amplifier 370. At this time, repetition frequency of the pulsed laser beam 30 that passes through the first optical switch 321 will be substantially equal to the target repetition frequency of the EUV light 252. That is, the first optical switch 321 causes the pulsed laser beam 30 having a wavelength within the amplifiable wavelength region to pass therethrough at a repetition frequency that reflects the target repetition frequency of the EUV light 252. The pulsed laser beam 30 that does not pass through the first optical switch 321 is reflected by the polarizer 321c of FIG. 3 and may be absorbed by a beam damper, which is not illustrated.

The control unit 330 may output the drive signals for the third optical switch 373 to the third optical switch 373 at timings delayed by the delay time Dp3 from the timings at which the laser output signals, of which the frequency has been divided, are input thereto. The third optical switch 373 changes the optical path of the incident pulsed laser beam 30 based on the input drive signals, and guides the pulsed laser beam 30 into the regenerative amplifier 370. At this time, the pulsed laser beam 30 which is introduced into the regenerative amplifier 370 is only the pulsed laser beam 30 which has been selectively transmitted through the first optical switch 321. That is, the third optical switch 373 introduces the pulsed laser beam 30 having a wavelength within the amplifiable wavelength region into the regenerative amplifier 370 at a repetition frequency that reflects the target repetition frequency of the EUV light 252. The pulsed laser beam 30 which is introduced into the regenerative amplifier 370 is amplified each time that it passes through the amplifier 375, while reciprocating between the resonator mirror 371 and the resonator mirror 372.

The control unit 330 may output the drive signals for the fourth optical switch 374 to the fourth optical switch 374 at timings delayed by the delay time Dp4 from the timings at which the laser output signals, of which the frequency has been divided, are input thereto. The fourth optical switch 374 changes the optical path of the incident pulsed laser beam 30 based on the input drive signals, and guides the pulsed laser beam 30 from the regenerative amplifier 370 to the high reflectance mirror. At this time, the fourth optical switch 374 causes the pulsed laser beam 30 having a wavelength within the amplifiable wavelength region and which has been appropriately amplified to be output from the regenerative amplifier 370 at a repetition frequency that reflects the target repetition frequency of the EUV light 252. The high reflectance mirror reflects the incident pulsed laser beam 30 and outputs the reflected pulsed laser beam 30 to the second optical switch 322.

The control unit 30 may output the drive signals for the second optical switch 322 to the second optical switch 322 at timings delayed by the delay time Dp2 from the timings at which the laser output signals, of which the frequency has been divided, are input thereto. The second optical switch 322 causes the incident pulsed laser beam 30 to pass therethrough based on the input drive signals, and outputs the pulsed laser beam 30 to the first through fourth amplifiers 351~354. At this time, the second optical switch 322 causes the pulsed laser beam 30 having a wavelength within the amplifiable wavelength region and which has been appropriately amplified to pass therethrough at a repetition frequency that reflects the target repetition frequency of the EUV light 252. The first through fourth amplifiers 351~354 sequentially and appropriately amplify the pulsed laser beam 30. The pulsed laser beam 30 which is amplified by the final fourth amplifier 354 is output to the exterior of the laser apparatus 3 as the pulsed laser beam 31 at a repetition frequency that reflects the target repetition frequency of the EUV light 252.

The other operations of the EUV light generating system 11 that includes the laser apparatus 3 of the first embodiment may be the same as those of the EUV light generating system 11 illustrated in FIG. 2.

<6.3 Effect>

In this manner, the control unit 330 is capable of outputting trigger signals to the first through fourth QCL's 311~314 at a repetition frequency that reflects the master repetition frequency, regardless of the target repetition frequency of the EUV light 252 required by the exposure apparatus control unit 61. Therefore, the load states of each of the first through fourth QCL's 311~314 will not change greatly and may become substantially constant, even if the target repetition frequency of the EUV light 252 required by the exposure apparatus control unit 61 is changed. Thereby, each of the first through fourth QCL's 311~314 is capable of outputting pulsed laser beams having wavelengths within the amplifiable wavelength region at substantially the same timings, regardless of the target repetition frequency of the EUV light 252. Meanwhile, each of the first and second optical switches 321 and 322 is capable of causing the pulsed laser beam 30 having a wavelength within the amplifiable wavelength region to pass therethrough at repetition frequencies that reflect the target repetition frequency of the EUV light 252. Each of the third and fourth optical switches 373 and 374 is capable of changing the optical path of the pulsed laser beam 30 having a wavelength within the amplifiable wavelength region at a repetition frequency that reflects the target repetition frequency of the EUV light 252. The regenerating amplifier 370 and the first through fourth amplifiers 351~354 appropriately amplify and output the pulsed laser beam 30 at repetition frequencies that reflect the target repetition frequency of the EUV light 252. Thereby, the laser apparatus 3 of the first embodiment is capable of outputting the pulsed laser beam at a repetition frequency that reflects the target repetition frequency of the EUV light 252, if the target repetition frequency of the EUV light 252 is changed. Additionally, the laser apparatus 3 of the first embodiment is capable of outputting an appropriately amplified pulsed laser beam 31 while suppressing changes in the load states of the first through fourth QCL's 311~314 even if the target repetition frequency of the EUV light 252 is changed. Accordingly, the laser apparatus 3 of the first embodiment is capable of appropriately amplifying the pulsed laser beams 30 and outputting the pulsed laser beam 31 having desired properties at desired timings, even when the operating conditions thereof are changed.

Figure 9:
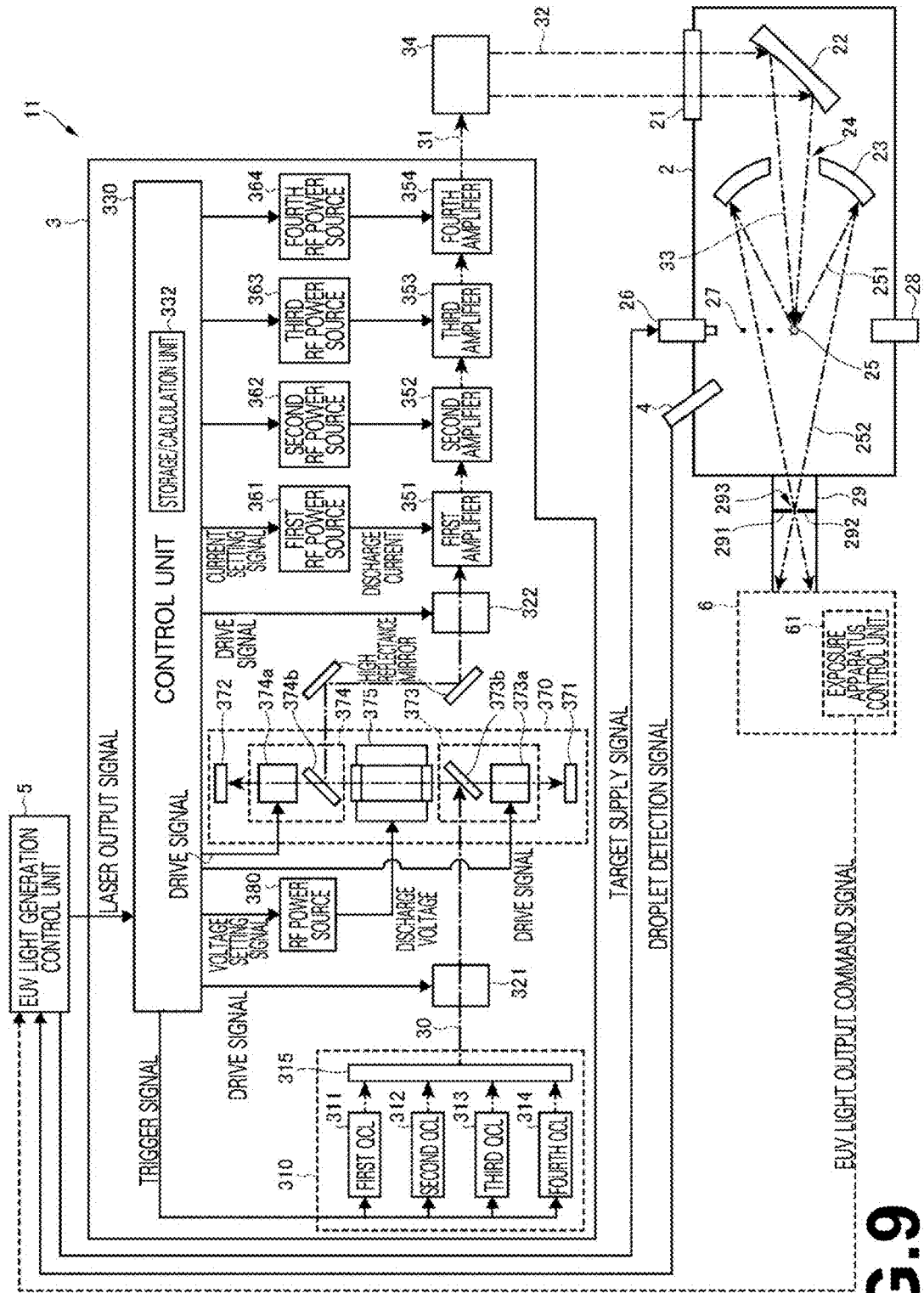
FIG. 9 is a diagram that illustrates the configuration of an EUV light generating system including a laser apparatus according to a second embodiment.

7. EUV Light Generating System Including Laser Apparatus According to Second Embodiment An EUV light generating system 11 that includes a laser apparatus 3 according to a second embodiment will be described with reference to FIG. 9 through FIG. 11. FIG. 9 is a diagram that illustrates the configuration of the EUV light generating system 11 including the laser apparatus 3 according to the second embodiment. The EUV light generating system 11 including the laser apparatus 3 according to the second embodiment may change the target repetition frequency of the droplets 271 according to a change in the target repetition frequency of the EUV light 252, in the case that the target repetition frequency of the EUV light 252 is changed by a request from the exposure apparatus control unit 61. In this case, the EUV light generating system 11 of the second embodiment changes the repetition frequency of the droplet detection signals for the droplets 271 which are output at the target repetition frequency of the droplets 271. The repetition frequency of the trigger signals which are output based on the droplet detection signals for the droplets 271 are also changed. Thereby, the load states of each of the first through fourth QCL's 311~314 will change. Therefore, the EUV light generating system 11 of the second embodiment may compensate for wavelength chirping by adjusting the delay times Dq1~Dq4 which are added to the trigger signals.

The configurations of the EUV light generation control unit 5 and the control unit 330 of the EUV light generating system 11 of the second embodiment may be different from those of the EUV light generating system 11 of the first embodiment illustrated in FIG. 7. The EUV light generation control unit 5 of the second embodiment is not required to include the master trigger generating unit 51, and output of frequency division setting signals to the control unit 330 is also not necessary. The control unit 330 of the second embodiment is not required to include the frequency divider 331. With respect to the configurations and operations of the EUV light generating system 11 of the second embodiment, those which are the same as those of the EUV light generating system 11 of the first embodiment illustrated in FIG. 7 and FIG. 8 will be omitted.

The EUV light generation control unit 5 illustrated in FIG. 9 may set the target repetition frequency not to the master repetition frequency, but to the same value as the target repetition frequency of the EUV light 252 included in the EUV light output command signals. The EUV light generation control unit 5 may generate target supply signals with the target repetition frequency of the droplets 271 set to the same value as the target repetition frequency of the EUV light 252. The EUV light generation control unit 5 may output the generated target supply signals to the target supply unit 26 at the same repetition frequency as the target repetition frequency of the EUV light 252. The target supply unit 26 is capable of generating and outputting the droplets 271 at the same repetition frequency as the target repetition frequency of the EUV light 252. The target sensor 4 is capable of detecting the droplets 271 which are output at the same repetition frequency as the target repetition frequency of the EUV light 252, and outputting droplet detection signals to the EUV light generation control unit 5. The droplet detection signals that reflect the target repetition frequency of the EUV light 252 included in the EUV light output command signals are input to the EUV light generation control unit 5.

The EUV light generation control unit 5 may generate laser output signals based on the droplet detection signals that reflect the target repetition frequency of the EUV light 252 included in the EUV light output command signals, and output the generated laser output signals to the control unit 330. Specifically, the EUV light generation control unit 5 may output the laser output signals for each pulse to the control unit 330 at timings synchronized with the timings at which the droplet detection signals for the droplets 271 which are output at the same repetition frequency as the target repetition frequency of the EUV light 252 are input thereto. Laser output signals that reflect the target repetition frequency of the EUV light 252 included in the EUV light output command signals are input to the control unit 330.

The control unit 330 illustrated in FIG. 9 may output drive signals to the optical switches, voltage setting signals to the RF power source 380, and current setting signals to the first through fourth RF power sources 361~364 at timings synchronized with the timings at which the laser output signals are input thereto, at the target repetition frequency of the EUV light 252. The first and second optical switches 321 and 322 cause incident pulsed laser beams 30 to pass therethrough at a repetition frequency that reflects the target repetition frequency of the EUV light 252, at timings synchronized with the timings at which the laser output signals are input to the control unit 330. The third and fourth optical switches 373 and 374 change the optical paths of incident pulsed laser beams 30 at a repetition frequency that reflects the target repetition frequency of the EUV light 252, at timings synchronized with the timings at which the laser output signals are input to the control unit 330. The amplifier 375 of the regenerative amplifier 370 amplifies and outputs the pulsed laser beam 30 at a repetition frequency that reflects the target repetition frequency of the EUV light 252, at timings synchronized with the timings at which the laser output signals are input to the control unit 330. The first through fourth amplifiers 351~354 amplify and output the pulsed laser beam 30 at a repetition frequency that reflects the target repetition frequency of the EUV light 252, at timings synchronized with the timings at which the laser output signals are input to the control unit 330.

In addition, the control unit 330 may output trigger signals to the first through fourth QCL's 311~314 at a repetition frequency that reflect the target repetition frequency of the EUV light 252, at timings synchronized with the timings at which the laser output signals are input thereto. At this time, the control unit 330 may output the trigger signals at timings delayed by predetermined delay times Dq1'~Dq4' from the timings at which the laser output signals are input thereto. The delay times Dq1'~Dq4' to be added to the trigger signals are the values obtained by adjusting the delay times Dq1~Dq4 according to changes in the load states of each of the first through fourth QCL's 311~314. The lengths of each of the delay times Dq1'~Dq4' may be determined such that pulsed laser beams having wavelengths within the amplifiable wavelength region are output at substantially the same timing, even if the load states of each of the first through fourth QCL's 311~314 change. The control unit 330 may include a storage/calculation unit 332 that calculates the delay times Dq1'~Dq4' which are added to the trigger signals.

Figure 10:
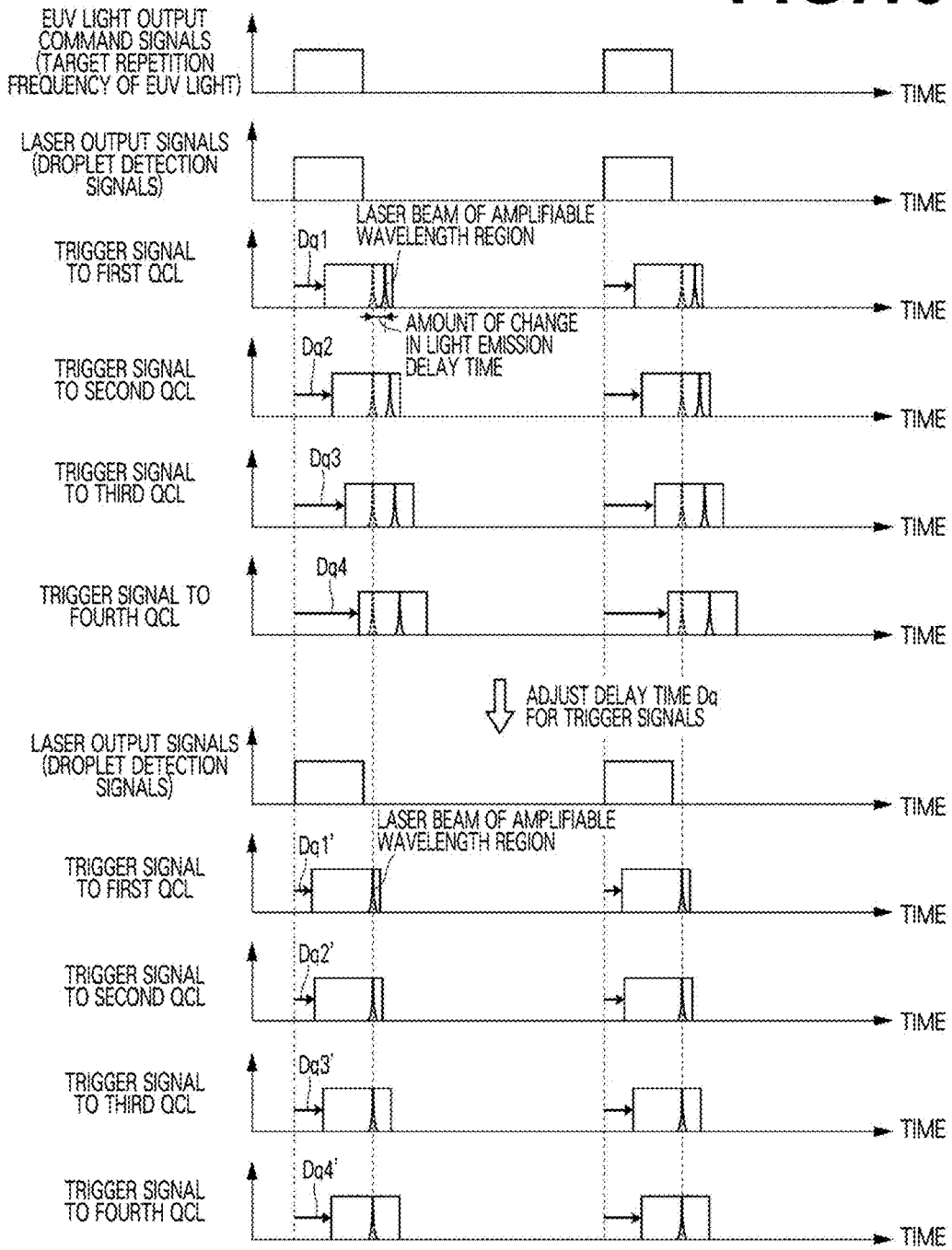
FIG. 10 is a diagram for explaining delay times which are added to trigger signals output from a control unit included in the laser apparatus according to the second embodiment.
Figure 11:
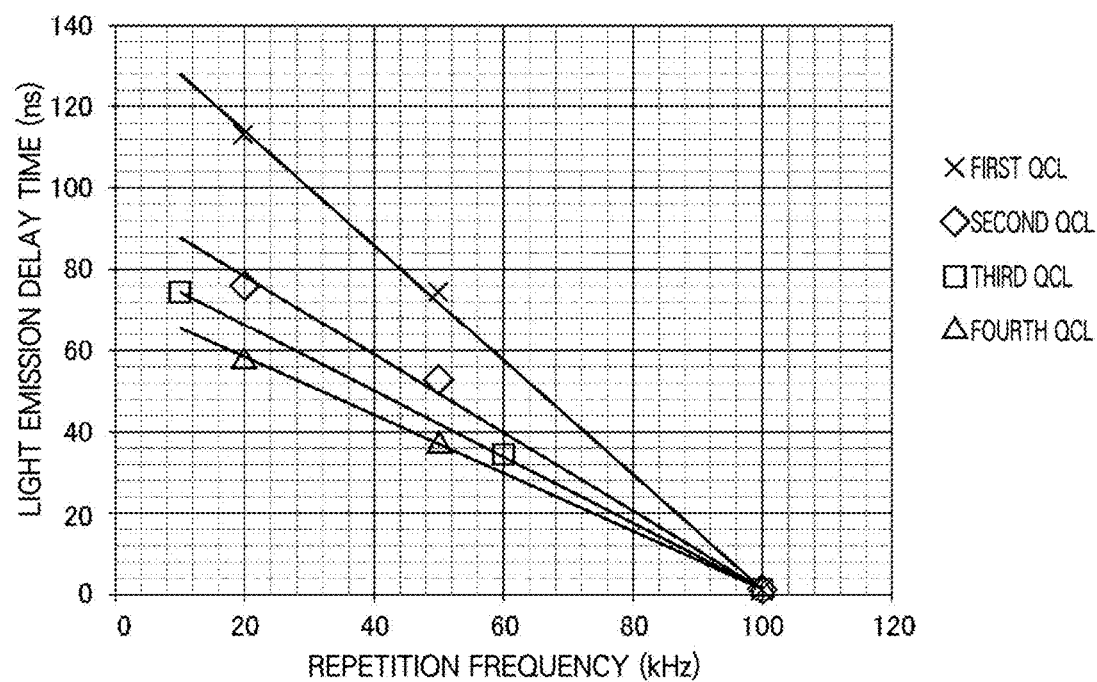
FIG. 11 is a diagram that illustrates the results of measurement of the relationship between light emission delay times of QCL's and repetition frequencies.

The delay times Dq1'~Dq4' which are added to the trigger signals will be described with reference to FIG. 10 and FIG. 11. FIG. 10 is a diagram for explaining the delay times Dq1'~Dq4' which are added to the trigger signals output from the control unit 330 included in the laser apparatus 3 according to the second embodiment. FIG. 11 is a diagram that illustrates the results of measurement of the relationship between light emission delay times of QCL's and repetition frequencies.

As described above, in the laser apparatus 3 of the second embodiment, each of the QCL's 311~314 may output a pulsed laser beam at a repetition frequency that reflects the target repetition frequency of the EUV light 252 included in the EUV light output command signals. That is, in the laser apparatus 3 of the second embodiment, the repetition frequency of the trigger signals will change if the target repetition frequency of the EUV light 252 is changed. Therefore, the load states of the first through fourth QCL's 311~314 will change. In this case, as shown in the upper portion of FIG. 10, the timing at which a pulsed laser beam having a wavelength within the amplifiable wavelength region is output from each of the first through fourth QCL's 311~314 will vary. That is, light emission delay times will be generated in each of the first through fourth QCL's 311~314. Particularly, as illustrated in FIG. 11, the light emission delay time of each of the first through fourth QCL's 311~314 will vary according to the repetition frequency of each of the first through fourth QCL's 311~314. FIG. 11 illustrates the manner in which the light emission delay times of each of the first through fourth QCL's 311~314 changes if the repetition frequency of each of the first through fourth QCL's 311~314 is changed from a reference value of 100 Hz. Further, as is clear from FIG. 11, the differences among the slopes in the graph of FIG. 11, the amount of change in light emission delay times is different for each of the first through fourth QCL's 311~314.

The storage/calculation unit 332 of the control unit 330 may store measurement results related to the relationship between the light emission delay times of the QCL's and repetition frequencies illustrated in FIG. 11 in advance. The storage/calculation unit 332 may perform the following process based on the measurement results related to the relationship between the light emission delay times of the QCL's and repetition frequencies illustrated in FIG. 11 when the target repetition frequency of the EUV light 252 is changed. The storage/calculation unit 332 may calculate the delay times Dq1'~Dq4' to be added to the trigger signals thereby.

That is, the storage/calculation unit 332 may refer to the measurement results related to the relationship between the light emission delay times of the QCL's and repetition frequencies illustrated in FIG. 11, and specify the amount of change in the light emission delay times for each of the first through fourth QCL's 311~314 corresponding to the target repetition frequency of the EUV light 252. At this time, in the case that the value of the light emission delay time is not included in the measurement results of FIG. 11, the storage/calculation unit 332 may derive a correlation formula between the light emission delay times and the repetition frequencies. This correlation formula may be expressed as a linear approximation function, a polynomial approximation function, or a higher order approximation function. The storage/calculation unit 332 may calculate the amount of change in the light emission delay times of each of the first through fourth QCL's 311~314 employing the correlation formula. Next, the storage/calculation unit 332 may subtract the amounts of change in the light emission delay times from the delay times Dq1~Dq4 which were added to the trigger signals prior to the target repetition frequency of the EUV light 252 being changed, to calculate the delay times Dq1'~Dq4'.

The control unit 330 may determine the values which are obtained by the storage/calculation unit 332 to be the new delay times Dq1'~Dq4' to be added to the trigger signals. The control unit 330 may output the trigger signals to the first through fourth QCL's 311~314 at timings which are delayed from the timings at which the laser output signals are delayed by the newly determined delay times Dq1'~Dq4', as illustrated in the lower portion of FIG. 10. Thereby, each of the first through fourth QCL's 311~314 is capable of outputting a pulsed laser beam at a repetition frequency that reflects the target repetition frequency of the EUV light 252, at timings synchronized with the timings at which the laser output signals are input to the control unit 330. The first through fourth QCL's 311~314 are capable of outputting pulsed laser beams having wavelengths within the amplifiable wavelength region at substantially the same timing, even if the load states thereof change.

With respect to the configurations and operations of the EUV light generating system 11 including the laser apparatus 3 of the second embodiment, they may be the same as those of the EUV light generating system 11 including the laser apparatus 3 of the first embodiment illustrated in FIG. 7 and FIG. 8.

The control unit 330 can adjust the delay times Dq1~Dq4 to become the delay times Dq1'~Dq4' based on the target repetition frequency of the EUV light 252 required by the exposure apparatus control unit 61, and output the trigger signals to each of the first through fourth QCL's 311~314 in the manner described above. Therefore, each of the first through fourth QCL's 311~314 is capable of outputting a pulsed laser beam having a wavelength within the amplifiable wavelength region at substantially the same timing, even if the target repetition frequency of the EUV light 252 is changed by a request from the exposure apparatus control unit 61 and the load states thereof change. Meanwhile, each of the first and second switches 321 and 322 is capable of causing the pulsed laser beam 30 having a wavelength within the amplifiable wavelength region to pass therethrough at repetition frequencies that reflect the target repetition frequency of the EUV light 252. Each of the third and fourth optical switches 373 and 374 is capable of changing the optical path of the pulsed laser beam 30 having a wavelength within the amplifiable wavelength region at a repetition frequency that reflects the target repetition frequency of the EUV light 252. The regenerating amplifier 370 and the first through fourth amplifiers 351~354 appropriately amplify and output the pulsed laser beam 30 at repetition frequencies that reflect the target repetition frequency of the EUV light 252. Thereby, the laser apparatus 3 of the second embodiment is capable of outputting the pulsed laser beam at a repetition frequency that reflects the target repetition frequency of the EUV light 252, even if the target repetition frequency of the EUV light 252 is changed.

Additionally, the laser apparatus 3 of the second embodiment is capable of outputting an appropriately amplified pulsed laser beam 31 while compensating for changes in the load states of the first through fourth QCL's 311~314, even if the target repetition frequency of the EUV light 252 is changed. Accordingly, the laser apparatus 3 of the second embodiment is capable of appropriately amplifying the pulsed laser beams 30 and outputting the pulsed laser beam 31 having desired properties at desired timings, even when the operating conditions thereof are changed.

8. EUV Light Generating System Including Laser Apparatus According to Third Embodiment An EUV light generating system 11 that includes a laser apparatus 3 according to a third embodiment will be described with reference to FIG. 12 and FIG. 13.

The trigger signals may include pulse widths of the trigger signals. The pulse widths of the trigger signals refer to the amounts of time that excitation current is supplied to the first through fourth QCL's 311~314 during each pulse. In other words, the pulse widths of the trigger signals are temporal widths during which the excitation current is supplied to the first through fourth QCL's 311~314 during each pulse.

FIG. 12 is a diagram for explaining the pulse widths W' of trigger signals output from the control unit 330 included in a laser apparatus 3 according to the third embodiment. FIG. 13 is a diagram that illustrates the relationship between the repetition frequency of trigger signals output to QCL's and pulse widths W'. The EUV light generating system 11 including the laser apparatus 3 according to the third embodiment may change the target repetition frequency of the droplets 271 according to a change in the target repetition frequency of the EUV light 252, in the case that the target repetition frequency of the EUV light 252 is changed by a request from the exposure apparatus control unit 61. In this case, the EUV light generating system 11 of the third embodiment changes the repetition frequency of the droplet detection signals for the droplets 271 which are output at the target repetition frequency of the droplets 271. The repetition frequency of the trigger signals which are output based on the droplet detection signals for the droplets 271 are also changed. Thereby, the load states of each of the first through fourth QCL's 311~314 will vary. Therefore, the EUV light generating system 11 of the third embodiment may compensate for wavelength chirping by adjusting the pulse widths W of the trigger signals.

The configuration of the control unit 330 of the EUV light generating system 11 of the third embodiment may be different from that of the EUV light generating system 11 of the second embodiment illustrated in FIG. 9. The storage/calculation unit 332 of the control unit 330 of the third embodiment is not required to store the measurement results related to the relationship between the light emission delay times of the QCL's and repetition frequencies illustrated in FIG. 11. With respect to the configurations and operations of the EUV light generating system 11 of the third embodiment, those which are the same as those of the EUV light generating system 11 of the second embodiment illustrated in FIG. 9 through FIG. 11 will be omitted.

The EUV light generation control unit 5 of the third embodiment may set the target repetition frequency of the droplets 271 to the same value as the target repetition frequency of the EUV light 252 included in the EUV light output command signals as in the EUV light generation control unit 5 of the second embodiment. The EUV light generation control unit 5 may generate target supply signals with the target repetition frequency of the droplets 271 set to the same value as the target repetition frequency of the EUV light 252. Further, the EUV light generation control unit 5 may generate laser output signals based on the droplet detection signals that reflect the target repetition frequency of the EUV light 252 included in the EUV light output command signals, and output the generated laser output signals to the control unit 330 as in the EUV light generation control unit 5 of the second embodiment.

The control unit 330 of the third embodiment may output trigger signals to the first through fourth QCL's 311~314 at a repetition frequency that reflect the target repetition frequency of the EUV light 252, at timings synchronized with the timings at which the laser output signals are input thereto. At this time, the control unit 330 may output the trigger signals having pulse widths W' at timings delayed by the predetermined delay times Dq1~Dq4 from the timings at which the laser output signals are input thereto, as illustrated in FIG. 12. The pulse widths W' of the trigger signals may be the values obtained by adjusting the pulse widths W prior to a change in the target repetition frequency of the EUV light 252 according to the change in the target repetition frequency of the EUV light 252. The size of the pulse widths W' of the trigger signals may be determined such that the duty ratio of the excitation current supplied to the first through fourth QCL's 311~314 do not change even if the target repetition frequency of the EUV light 252 is changed. The control unit 330 may include a storage/calculation unit 332 that calculates the pulse widths W' of the trigger signals.

Here, the relationship between wavelength chirping of QCL's and the duty ratio of excitation current which is supplied to the QCL's will be described. For example, the relationship between a change in temperature $\Delta T$ of the semiconductor element 3111 of the first QCL 311 that causes wavelength chirping and the duty ratio of the excitation current which is supplied to the first QCL 311 can be expressed by the following formula.

$$\Delta T = Rth \cdot (I \cdot V) \cdot D$$

wherein Rth is the thermal resistance of the semiconductor element 3111, I is the current value of the excitation current which is supplied to the semiconductor element 3111, V is the voltage which is generated in the semiconductor element 3111, and D is the duty ratio of the excitation current which is supplied to the semiconductor element 3111.

The duty ratio of the excitation current which is supplied to the semiconductor element 3111 may be the same value as the duty ratio of the trigger signals. The duty ratio of the trigger signals may be the product of the pulse width of the trigger signals and the repetition frequency.

In the formula above, it can be understood that if the thermal resistance Rth is made constant and the current value I is maintained constant, the voltage V does not change and the change in temperature $\Delta T$ depends on the duty ratio D. Accordingly, if the pulse width of the trigger signals is adjusted such that the set value of the excitation current included in the trigger signals is maintained and the duty ratio of the trigger signals do not change, the change in temperature $\Delta T$ can be suppressed even if the target repetition frequency of the EUV light 252 is changed. Therefore, changes in the load state of the first QCL 311 can be suppressed.

Therefore, the storage/calculation unit 332 of the control unit 330 may store the duty ratios of the trigger signals which are output to each of the first through fourth QCL's 311~314 in advance. The duty ratios which are stored in the storage/calculation unit 332 may be constant values which are empirically determined in advance from relationships with the delay times Dq1~Dq4. The duty ratios which are stored in the storage/calculation unit 332 may be a constant values such as 40,000 ns·kHz. The storage/calculation unit 332 may calculate the pulse widths W' of the trigger signals by performing the following process based on the duty ratios which are stored in advance when the target repetition frequency of the EUV light 252 is changed. For example, if the target repetition frequency of the EUV light 252 is changed from 100 kHz to 50 kHz, the storage/calculation unit 332 can calculate the pulse widths W' by the following formula.

Pulse Width W'=Duty Ratio(40,00 ns·kHz)/Repetition Frequency(50 kHz)=800 ns

Alternatively, the storage/calculation unit 332 may store a table that shows the relationship between the repetition frequencies of trigger signals and pulse widths as shown in FIG. 13, in advance. In this case, the storage/calculation unit 332 may refer to the table to specify the pulse widths W' of the trigger signals if the target repetition frequency of the EUV light 25 is changed.

The control unit 330 may determine the values which are obtained by the storage/calculation unit 332 to be the new pulse width W' of the trigger signals. The control unit 330 may output the trigger signals having the newly determined pulse widths W' to the first through fourth QCL's 311~314 at timings which are delayed from the timings at which the laser output signals are input by the delay times Dq1~Dq4, as illustrated in the lower portion of FIG. 12. Thereby, each of the first through fourth QCL's 311~314 is capable of outputting a pulsed laser beam at a repetition frequency that reflects the target repetition frequency of the EUV light 252, at timings synchronized with the timings at which the laser output signals are input. Additionally, changes in the load states of each of the first through fourth QCL's 311~314 can be suppressed, and pulsed laser beams having wavelengths within the amplifiable frequency region can be output at substantially the same timing. Note that the storage/calculation unit 332 may store duty ratios having different values for each of the first through fourth QCL's 311~314 in the case that is favorable for different values to be employed as the duty ratios for each of the first through fourth QCL's 311~314.

With respect to the other configurations and operations of the EUV light generating system 11 of the third embodiment, they may be the same as those of the EUV light generating system 11 including the laser apparatus 3 of the second embodiment illustrated in FIG. 9 through FIG. 11.

The control unit 330 can adjust the pulse widths W of the trigger signals to become the pulse widths W' based on the target repetition frequency of the EUV light 252 required by the exposure apparatus control unit 61, and output the trigger signals to each of the first through fourth QCL's 311~314 in the manner described above. Therefore, changes in the load states of the first through fourth QLC's 311~314 are suppressed, even if the target repetition frequency of the EUV light 252 is changed by a request from the exposure apparatus control unit 61. For this reason, each of the first through fourth QCL's 311~314 is capable of outputting a pulsed laser beam having a wavelength within the amplifiable wavelength region at substantially the same timing. Meanwhile, each of the first and second optical switches 321 and 322 is capable of causing the pulsed laser beam 30 having a wavelength within the amplifiable wavelength region to pass therethrough at repetition frequencies that reflect the target repetition frequency of the EUV light 252. Each of the third and fourth optical switches 373 and 374 is capable of changing the optical path of the pulsed laser beam 30 having a wavelength within the amplifiable wavelength region at a repetition frequency that reflects the target repetition frequency of the EUV light 252. The regenerating amplifier 370 and the first through fourth amplifiers 351~354 appropriately amplify and output the pulsed laser beam 30 at repetition frequencies that reflect the target repetition frequency of the EUV light 252. Thereby, the laser apparatus 3 of the third embodiment is capable of outputting the pulsed laser beam 31 at a repetition frequency that reflects the target repetition frequency of the EUV light 252, even if the target repetition frequency of the EUV light 252 is changed. Additionally, the laser apparatus 3 of the third embodiment is capable of outputting an appropriately amplified pulsed laser beam 31 while suppressing changes in the load states of the first through fourth QCL's 311~314, even if the target repetition frequency of the EUV light 252 is changed. Accordingly, the laser apparatus 3 of the third embodiment is capable of appropriately amplifying the pulsed laser beams 30 and outputting the pulsed laser beam 31 having desired properties at desired timings, even when the operating conditions thereof are changed.

9. Other Items

<9.1 Hardware Environment of Control Units>

Those skilled in the art would understand that the matters described above can be executed by combining a general purpose computer or a programmable controller with a program module or a software application. Generally, the program module will include routines, programs, components, and data structures, etc., for executing the processes described in the present disclosure.

Figure 14:
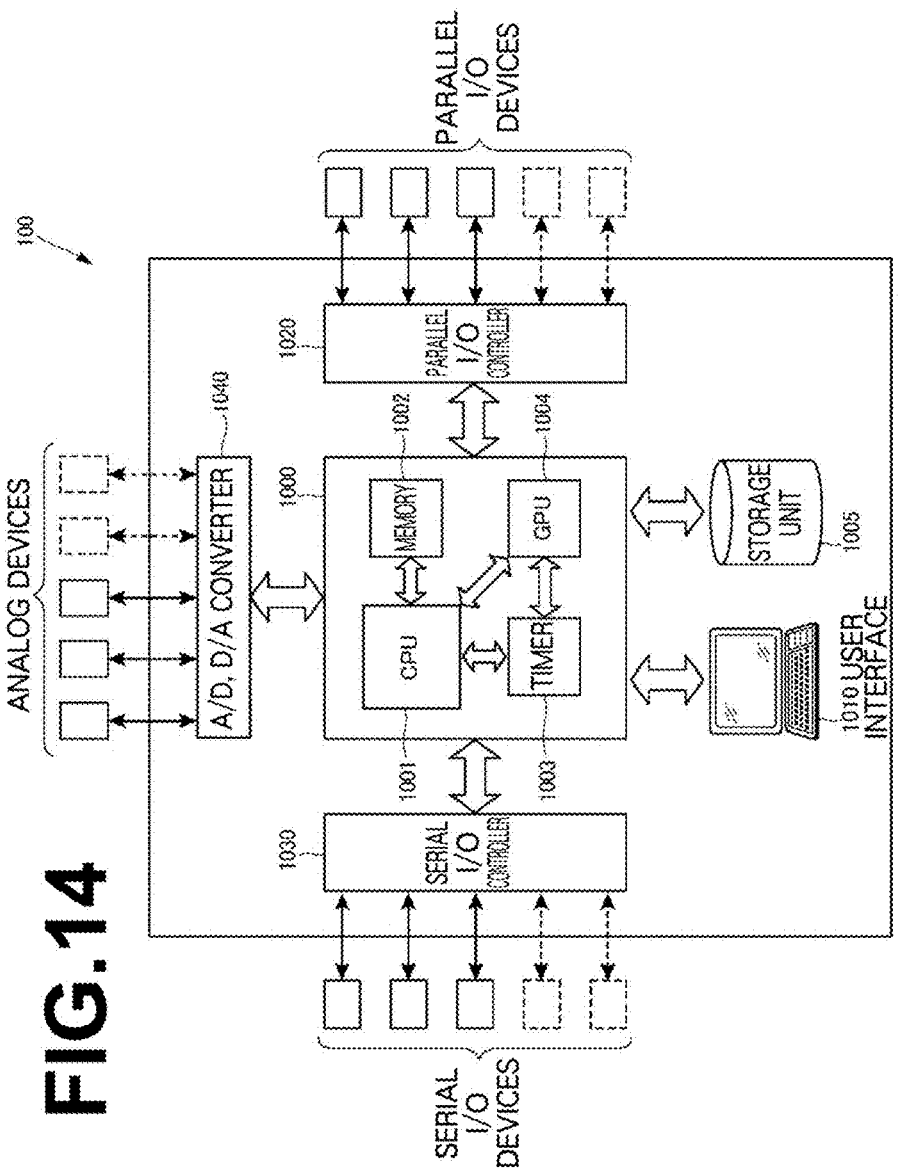
FIG. 14 is a block diagram that illustrates the hardware environments of control units.

FIG. 14 is a block diagram that illustrates an exemplary hardware environment in which various aspects of the present disclosure can be implemented. The exemplary hardware environment 100 illustrated in FIG. 14 may include a processing unit 1000, a storage unit 1005, a user interface 1010, a parallel I/O controller 1020, a serial I/O controller 1030, and an A/D, D/A converter 1040. However, the configuration of the hardware environment 100 is not limited to that described above.

The processing unit 1000 may include a central processing unit (CPU) 1001, a memory 1002, a timer 1003, and a graphics processing unit (GPU) 1004. The memory 1002 include a random access memory (RAM) and a read only memory (ROM). The CPU 1001 may be any commercially available processor. A dual microprocessor or any other multiprocessor architecture may be employed as the CPU 1001.

The components illustrated in FIG. 14 may be interconnected with each other to execute the processes described above.

During operation, the processing unit 1000 may read and execute programs stored in the storage unit 1005, read data together with the programs from the storage unit 1005, and write data to the storage unit 1005. The CPU 1001 may execute programs read out from the storage unit 1005. The memory 1002 may be a work area in which programs executed by the CPU 1001 and data used in the operation of the CPU 1001 are temporarily stored. The timer 1003 may measure temporal intervals and output the results of measurement to the CPU 1001 according to the execution of programs. The GPU 1004 may process image data according to programs read from the storage unit 1005, and output the results of processing to the CPU 1001.

The parallel I/O controller 1020 may be connected to parallel I/O devices which are capable of communicating with the processing unit 1000, such as the exposure apparatus control unit 61, the EUV light generation control unit 5, the laser beam propagating direction control unit 34, and the control unit 330. The parallel I/O controller 1020 may control communications among the processing unit 1000 and the parallel I/O devices. The serial I/O controller 1030 may be connected to serial I/O devices which are capable of communicating with the processing unit 1000, such as the first through fourth RF power sources 361~364, the RF power source 380, the first through fourth optical switches 321, 322, 373, and 374, the target supply unit 26, and the first through fourth QCL's 311~314. The serial I/O controller 1030 may control communications among the processing unit 1000 and the serial I/O devices. The A/D, D/A converter 1040 may be connected to analog devices, including various sensors such as a temperature sensor, a pressure sensor, a vacuum meter, and the target sensor 4, via an analog port. The A/D, D/A converter may control communications among the processing unit 1000 and the analog devices, and perform A/D as well as D/A conversion of the contents of the communications.

The user interface 1010 may display the progress of programs which are being executed by the processing unit 1000 to an operator, such that the operator can command the processing unit 1000 to cease executing programs or to execute interruption routines.

The exemplary hardware environment 100 may be applied to the configurations of the exposure apparatus control unit 61, the EUV light generation control unit 5, the laser propagating direction control unit 34, and the control unit 330 of the present disclosure. Those skilled in the art would understand that these controllers may also be realized in a distributed computing environment, that is, an environment in which tasks are executed by processing units which are connected to each other via a communications network. In the present disclosure, the exposure apparatus control unit 61, the EUV light generation control unit 5, the laser propagating direction control unit 34, and the control unit 330 may be connected to each other via a communications network such as an Ethernet and the Internet. In a distributed computing environment, program modules may be stored in both local and remote memory storage devices.

<9.1 Modification of Laser Apparatus Related to Generation of Trigger Signals>

As described above, the trigger signals may be signals that provide momentum for each of the first through fourth QCL's 311~314 to perform laser oscillation and output pulsed laser beams. Set values for the excitation current to be supplied to each of the first through fourth QCL's 311~314 may be included in the trigger signals. The pulse widths of the trigger signals may be temporal widths which are the amounts of time that excitation current is supplied to the first through fourth QCL's 311~314 during each pulse. In the laser apparatuses 3 of the first through third embodiments, the trigger signals to be output to the first through fourth QCL's 311~314 are generated by the control unit 330. However, the laser apparatus 3 of the present disclosure is not limited to such a configuration. The laser apparatus 3 of the present disclosure may be configured such that the trigger signals are generated by first through fourth QCL control units which are respectively included in the first through fourth QCL's 311~314. That is, the laser apparatus 3 of the present disclosure may adopt the modification described below related to the generation of trigger signals.

Figure 15:
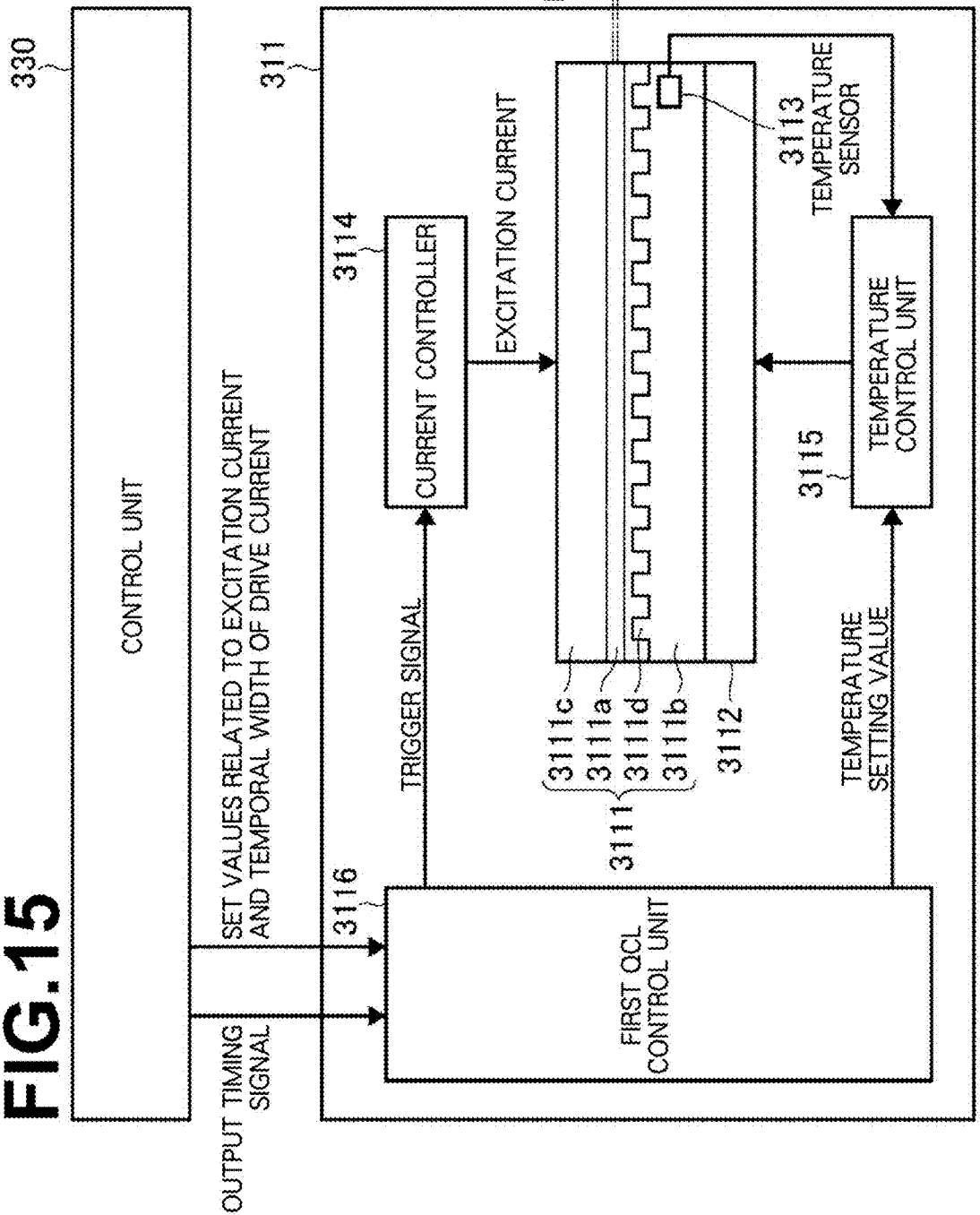
FIG. 15 is a diagram for explaining a modification of a laser apparatus related to the generation of trigger signals.

A modification of the laser apparatus 3 related to the generation of trigger signals will be described with reference to FIG. 15. FIG. 15 is a diagram for explaining the modification of the laser apparatus 3 related to the generation of trigger signals. Note that the description of FIG. 15 will be given for the first QCL 311 as an example.

The control unit 330 provided in the laser apparatus 3 according to the modification may output set values related to the current values and the temporal widths of excitation currents and output timing signals to the first through fourth QCL control units instead of the trigger signals. The output timing signals may be signals that notify the first through fourth QCL's 311~314 of timings to output pulsed laser beams. Predetermined delay times Dq1~Dq4 or Dq1'~Dq4' may be added to the output timing signals in the same manner as the trigger signals. The output timing signals may be output from the control unit 330. The set values related to the current values and the temporal widths of the excitation currents may be set values that determine the current values and the temporal widths of the pulse waveforms of the excitation currents which are supplied to the semiconductor elements of the first through fourth QCL's 311~314. The temporal widths of the excitation currents in the set values may define the pulse widths W or the pulse widths W' of the trigger signals.

The first QCL 311 of the laser apparatus 3 according to the modification may include the semiconductor element 3111, the Peltier element 3112, a temperature sensor 3113, a current controller 3114, a temperature control unit 3115, and a first QCL control unit 3116, as illustrated in FIG. 15.

The set values related to current value and the temporal width of excitation current which are output from the control unit 330 and supplied to the first QCL 311 may be input to the first QCL control unit 3116. The first QCL control unit 3116 may generate a trigger signal having a pulse waveform for an excitation current corresponding to the current value and the temporal width of the input set values. The output timing signal for the first QCL 311 which is output from the control unit 330 may be input to the first QCL control unit 3116. The first QCL control unit 3116 may output the generated trigger signal to the current controller 3114 according to the output timing signal. The first QCL control unit 3116 may output a temperature setting value for maintaining the temperature of the semiconductor element 3111 at a predetermined temperature to the temperature control unit 3115.

The trigger signal which is output from the first QCL control unit 3116 may be input to the current controller 3114. The current controller 3114 may supply excitation current according to the pulse waveform of the input trigger signal to the pair of electrode layers provided on the semiconductor element 3111. Excitation current corresponding to the trigger signal flows in the semiconductor layer 3111*b*, the semiconductor layer 3111*c*, and the active layer 3111*a* which are sandwiched between the pair of electrode layers.

The temperature sensor 3113 may detect the temperature of the semiconductor element 3111, and output a detection signal to the temperature control unit 3115.

The temperature setting value which is output from the first QCL control unit 3116 may be input to the temperature control unit 3115. The detection signal which is output from the temperature sensor 3113 may be input to the temperature control unit 3115. The temperature control unit 3115 may output a signal that controls the cooling operation of the Peltier element 3112 such that the detected temperature value represented by the input detection signal approaches the input temperature setting value to the Peltier element 3112.

By the configuration described above, the first QCL 311 of the laser apparatus 3 according to the modification generates the trigger signal at the first QCL control unit 3116 under control of the control unit 330, and supplies excitation current according to the trigger signal to the semiconductor element 3111. Thereby, the first QCL 3111 of the laser apparatus according to the modification is capable of outputting a pulsed laser beam from the semiconductor element 3111 under control of the control unit 330.

Note that the configurations of the semiconductor element 3111 and the Peltier element 3112 illustrated in FIG. 15 may be the same as those of the semiconductor element 3111 and the Peltier element 3112 illustrated in FIG. 5. The second through fourth QCL's 312~314 of the laser apparatus 3 according to the modification may be configured in the same manner as the first QCL 311 illustrated in FIG. 15.

<9.3 Other Modifications>

Portions or the entireties of the EUV light generation control unit 5 and the control unit 330 may be combined to constitute an integrated control unit.

It would be obvious to those skilled in the art that the technologies which are described in the above embodiments and the modification may be combined with each other.

For example, the control unit 330 and the first through fourth QCL's 311~314 of the laser apparatus 3 according to the modification may be applied as the control unit 330 and the first through fourth QCL's 311~314 of the laser apparatuses 3 of the first through third embodiments.

The description above is intended to be illustrative and the present disclosure is not limited thereto. Therefore, it would be obvious to those skilled in the art that various modifications to the embodiments of the present disclosure would be possible as long as they do not stray from the spirit and the scope of the appended claims.

The terms which are employed in the present specification and the appended claims are to be interpreted as "no limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. A laser apparatus for use with an extreme ultraviolet light generating apparatus that generates extreme ultraviolet light at a repetition frequency which is set in advance, comprising:
   a semiconductor laser that outputs a laser beam when a trigger signal is input thereto;
   an optical switch that switches between a state in which the laser beam passes therethrough and a state in which the laser beam does not pass therethrough, provided along the optical path of the laser beam; and
   a control unit having a storage/calculation unit, the control unit configured to change output timing of the trigger signal which is output to the semiconductor laser based on the repetition frequency in synchronization with the repetition frequency, and to control the optical switch such that the laser beam passes therethrough at the repetition frequency, wherein
   the storage/calculation unit is configured to store, in advance, measurement results related to a relationship between time lags from output timings of the trigger signals to timings at which the laser beam is output from the semiconductor laser and the repetition frequency,
   the storage/calculation unit is configured to refer to the measurement results to calculate the output timing of the trigger signal,
   the control unit determines the output timing calculated by the storage/calculation unit as an updated output timing of the trigger signal,
   the control unit determines the updated output timing of the trigger signal according to a change in the load state of the semiconductor laser; and
   the semiconductor laser outputs the laser beam in synchronization with the repetition frequency, based on the output timing which is determined by the control unit.

2. A laser apparatus as defined in claim 1, further comprising:
   a regenerative amplifier that amplifies the laser beam which is output from the semiconductor laser and includes the optical switch.

3. A laser apparatus as defined in claim 1, wherein:
   the storage/calculation unit derives a correlation formula between the time lags and the repetition frequency based on the measurement results, and calculates the output timing of the trigger signal based on the correlation formula.

4. A laser apparatus as defined in claim 1, wherein the semiconductor laser is a distributed feedback quantum cascade laser.

5. A laser apparatus as defined in claim 1, wherein the semiconductor laser includes a plurality of semiconductor lasers that output pulsed laser beams of wavelengths which are included within a wavelength region capable of being amplified by a laser amplifier having $CO_2$ gas as an amplification medium.

6. A laser apparatus as defined in claim 5, wherein the plurality of semiconductor lasers output pulsed laser beams having wavelengths which are different from each other.

7. A laser apparatus as defined in claim 5, wherein trigger signals input to the plurality of semiconductor lasers include set values for excitation currents which are supplied to each of the plurality of semiconductor lasers.

8. A laser apparatus as defined in claim 2, wherein the regenerative amplifier includes a slab amplifier.

9. A laser apparatus as defined in claim 1, wherein the storage/calculation unit derives a correlation formula between light emission delay times and repetition frequencies of the semiconductor laser.

10. A laser apparatus as defined in claim 9, wherein the correlation formula is expressed as a linear approximation function, a polynomial approximation function or a higher order approximation function.

* * * * *